United States Patent
Kawamura et al.

(10) Patent No.: US 8,198,546 B2
(45) Date of Patent: Jun. 12, 2012

(54) PRINTED WIRING BOARD

(75) Inventors: Yoichiro Kawamura, Gifu (JP); Shigeki Sawa, Gifu (JP); Katsuhiko Tanno, Gifu (JP); Hironori Tanaka, Gifu (JP); Naoaki Fujii, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 587 days.

(21) Appl. No.: 11/944,498

(22) Filed: Nov. 23, 2007

(65) Prior Publication Data
US 2008/0149369 A1 Jun. 26, 2008

Related U.S. Application Data

(63) Continuation of application No. PCT/JP2006/310413, filed on May 18, 2006.

(30) Foreign Application Priority Data

May 23, 2005 (JP) .............................. 2005-149086
Jun. 30, 2005 (JP) .............................. 2005-192861

(51) Int. Cl.
*H05K 1/16* (2006.01)

(52) U.S. Cl. ........ 174/260; 174/255; 174/257; 174/258; 174/261; 174/262; 174/264; 428/344; 428/413; 428/458; 257/684; 257/700; 257/734; 29/825; 29/831; 29/846

(58) Field of Classification Search .......... 174/260–262, 174/264, 255, 257, 258; 29/825, 829, 831, 29/846; 428/344, 413, 458; 257/684, 700, 257/734
See application file for complete search history.

(56) References Cited

U.S. PATENT DOCUMENTS

| | | | | |
|---|---|---|---|---|
| 4,372,800 | A * | 2/1983 | Oizumi et al. | 156/307.3 |
| 4,880,589 | A * | 11/1989 | Shigemoto et al. | 264/216 |
| 4,946,524 | A * | 8/1990 | Stumpf et al. | 156/87 |
| 5,226,929 | A * | 7/1993 | Morii et al. | 51/298 |
| 5,329,423 | A * | 7/1994 | Scholz | 361/760 |
| 5,591,488 | A * | 1/1997 | Sch afer et al. | 427/97.2 |
| 5,616,256 | A * | 4/1997 | Demura | 216/18 |
| 5,648,159 | A * | 7/1997 | Sato | 428/327 |
| 5,677,450 | A * | 10/1997 | Suzuki et al. | 544/194 |
| 5,827,604 | A * | 10/1998 | Uno et al. | 428/209 |
| 5,830,563 | A * | 11/1998 | Shimoto et al. | 428/209 |
| 5,849,460 | A * | 12/1998 | Kawai et al. | 430/280.1 |
| 5,929,566 | A * | 7/1999 | Azami | 315/5.38 |
| 6,120,670 | A * | 9/2000 | Nakajima | 205/125 |
| 6,133,377 | A * | 10/2000 | Nakamura et al. | 525/109 |

(Continued)

FOREIGN PATENT DOCUMENTS

EP 1 615 264 A2 1/2006

(Continued)

*Primary Examiner* — Xiaoliang Chen
(74) *Attorney, Agent, or Firm* — Oblon, Spivak, McClelland, Maier & Neustadt, L.L.P.

(57) ABSTRACT

A method of manufacturing a printed wiring board includes preparing a wiring substrate having a conductive circuit, coating a solder-resist layer over the conductive circuit, leveling a surface of the solder-resist layer so as to obtain a maximum surface roughness in a predetermined range, removing the resin film from the surface of the solder-resist layer, and forming multiple openings in the surface of the solder-resist layer to expose multiple portions of the conductive circuit so as to form multiple conductive pads for mounting an electronic components.

22 Claims, 9 Drawing Sheets

U.S. PATENT DOCUMENTS

| | | | |
|---|---|---|---|
| 6,174,353 B1 * | 1/2001 | Yuan et al. | 106/1.11 |
| 6,198,165 B1 * | 3/2001 | Yamaji et al. | 257/734 |
| 6,204,454 B1 * | 3/2001 | Gotoh et al. | 174/255 |
| 6,256,207 B1 * | 7/2001 | Horiuchi et al. | 361/760 |
| 6,323,439 B1 * | 11/2001 | Kambe et al. | 174/262 |
| 6,395,625 B1 * | 5/2002 | Maa et al. | 438/612 |
| 6,443,351 B1 * | 9/2002 | Huang et al. | 228/103 |
| 6,585,837 B1 * | 7/2003 | Keil et al. | 156/64 |
| 6,591,495 B2 * | 7/2003 | Hirose et al. | 29/846 |
| 6,719,185 B2 * | 4/2004 | Suzuki | 228/173.1 |
| 6,742,701 B2 * | 6/2004 | Furuno et al. | 228/205 |
| 6,753,033 B2 * | 6/2004 | Hashimoto et al. | 427/96.2 |
| 6,753,480 B2 * | 6/2004 | Maa et al. | 174/255 |
| 6,780,502 B2 * | 8/2004 | Inaba et al. | 428/327 |
| 6,809,268 B2 * | 10/2004 | Hayashi et al. | 174/260 |
| 6,888,344 B2 * | 5/2005 | Maekawa et al. | 324/158.1 |
| 6,942,756 B2 * | 9/2005 | Suzuki et al. | 162/136 |
| 6,971,429 B2 * | 12/2005 | Keil et al. | 156/382 |
| 7,087,991 B2 * | 8/2006 | Chen et al. | 257/700 |
| 7,189,927 B2 * | 3/2007 | Sakuyama | 174/261 |
| 7,279,771 B2 * | 10/2007 | Sunohara et al. | 257/516 |
| 7,371,974 B2 * | 5/2008 | Toyoda et al. | 174/262 |
| 2001/0039300 A1 * | 11/2001 | Suzuki et al. | 522/31 |
| 2002/0189088 A1 * | 12/2002 | Kawashima et al. | 29/831 |
| 2003/0145458 A1 * | 8/2003 | Tani et al. | 29/830 |
| 2003/0178229 A1 * | 9/2003 | Toyoda et al. | 174/261 |
| 2004/0207080 A1 | 10/2004 | Nakano | |
| 2006/0237225 A1 * | 10/2006 | Kariya et al. | 174/260 |
| 2006/0244142 A1 * | 11/2006 | Waidhas et al. | 257/738 |
| 2006/0289203 A1 | 12/2006 | Oda | |
| 2007/0086147 A1 | 4/2007 | Kawamura et al. | |
| 2007/0096327 A1 | 5/2007 | Kawamura et al. | |

FOREIGN PATENT DOCUMENTS

| | | |
|---|---|---|
| JP | 9-298356 | 11/1997 |
| JP | 10-107446 | 4/1998 |
| JP | 11-307916 | 11/1999 |
| JP | 2000-208913 A | 7/2000 |
| JP | 2000-307024 A | 11/2000 |
| JP | 2003-124387 A | 4/2003 |
| JP | 2004-179578 A | 6/2004 |
| JP | 2004-207370 | 7/2004 |
| JP | 2004-319779 A | 11/2004 |
| KR | 1998-018040 | 6/1998 |
| KR | 10-0268632 | 10/2000 |
| WO | 03/034487 A1 | 4/2003 |
| WO | WO 2004/103039 A1 | 11/2004 |

* cited by examiner

PRINTED WIRING BOARD

CROSS-REFERENCE TO RELATED APPLICATIONS

This application is a continuation application of an International Application No. PCT/JP2006/310413, filed May 18, 2006, which claims priority to Japanese Application Nos. 2005-149086 filed May 23, 2005 and 2005-192861 filed Jun. 30, 2005. The contents of those applications are incorporated herein by reference in their entirety.

BACKGROUND OF INVENTION

1. Field of the Invention

The present invention relates to a printed wiring board such as a package substrate to mount electronic components such as an IC.

2. Discussion of the Background

FIG. 11 shows a printed wiring board which structures a package substrate relating to background art. In printed wiring board 210, to mount IC chip 290 on the substrate, multiple solder bumps 276 are formed on the substrate, and solder-resist layer 270 is formed. Conductive circuit 258 including solder pads 275 is formed on the substrate, and solder-resist layer 270 is formed to coat conductive circuit 258. Openings 271 corresponding to the solder pads are formed in solder-resist layer 270, and then on the surfaces of solder pads 275 exposed through openings 271, a nickel-plated layer and a gold-plated layer (those two layers are indicated by numerical reference 274) are formed. Underfill (resin for sealing) 288 is filled between IC chip 290 and the substrate.

SUMMARY OF THE INVENTION

According to one aspect of the present invention, a printed wiring board includes a wiring substrate including a conductive circuit, and a solder-resist layer formed over the wiring substrate and having multiple opening exposing multiple portions of the conductive circuit, respectively. The multiple portions of the conductive circuit form multiple conductive pads which allows an electronic component to be mounted. The solder-resist layer has a surface including an electronic component mounting region, and the electronic component mounting region has a maximum roughness in the range of 0.3-7.5 μm.

According to another aspect of the present invention, a printed wiring board includes a wiring substrate including a conductive circuit, and a solder-resist layer formed over the wiring substrate and having multiple opening exposing multiple portions of the conductive circuit, respectively. The multiple portions of the conductive circuit form multiple conductive pads which allows an electronic component to be mounted. The solder-resist layer has a surface including an electronic component mounting region, and the electronic component mounting region has an arithmetic mean deviation (Ra) of roughness in the range of 0.2-0.7 μm.

According to yet another aspect of the present invention, a method of manufacturing a printed wiring board includes preparing a wiring substrate having a conductive circuit, coating a solder-resist layer over the conductive circuit, leveling a surface of the solder-resist layer so as to obtain a maximum surface roughness in a predetermined range, removing the resin film from the surface of the solder-resist layer, and forming multiple openings in the surface of the solder-resist layer to expose multiple portions of the conductive circuit so as to form multiple conductive pads for mounting an electronic components.

BRIEF DESCRIPTION OF THE DRAWINGS

A more complete appreciation of the invention and many of the attendant advantage thereof will be readily obtained as the same becomes better understood by reference to the following detailed description when considered in connection with the accompanying drawings, wherein.

DESCRIPTION OF THE EMBODIMENTS

Figure 1A:
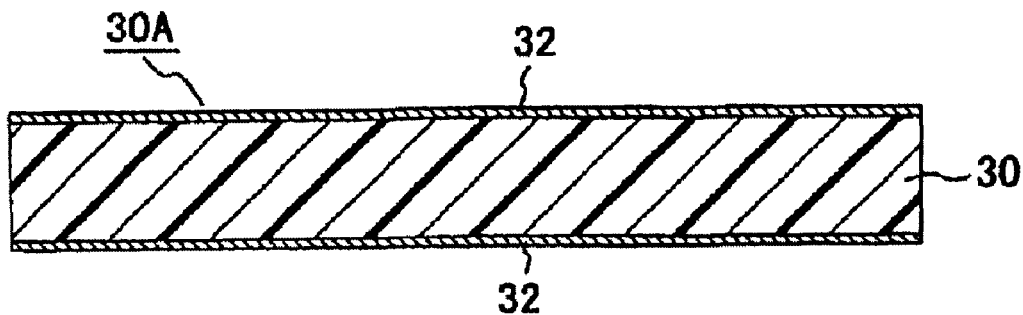
FIGS. 1(a)-1(d) are schematic views illustrating steps of manufacturing a printed wiring board according to Example 1 of the present invention.

The embodiments will now be described with reference to the accompanying drawings, wherein like reference numerals designate corresponding or identical elements throughout the various drawings.

A printed wiring board according to an embodiment of the present invention has a solder-resist layer formed on a surface of a wiring substrate that has a conductive circuit, and on a surface of the solder-resist layer a leveling treatment is conducted at least in the electronic component mounting region or the leveled surface is further roughened.

Namely, in a printed wiring board, a wiring substrate has a conductive circuit formed thereon and the conductive circuit is coated with a solder-resist layer in which openings are formed. Portions of the conductive circuit exposed through the openings are formed as conductive pads to mount electronic components. Alternatively, in a printed wiring board, a wiring substrate has a conductive circuit formed thereon and the conductive circuit is coated with a solder-resist layer in which openings are formed. Portions of the conductive circuit exposed through the openings are formed as conductive pads, solder bumps are formed on the conductive pads, an electronic component is mounted via the solder bumps, and the space between the electronic component and the solder-resist layer is resin-sealed with underfill material. In such wiring boards, a leveling treatment is conducted on the solder-resist layer, at least in the electronic component mounting region, and a roughening treatment may be further conducted on the leveled surface.

If the surface is leveled when forming a solder-resist layer, or if the surface is leveled by thermal-pressing or polishing after a solder-resist layer is formed, significant roughness caused by the presence of the conductive circuit underneath the solder-resist layer becomes smaller and the distance variation between the surface of the solder-resist layer and the bottom surface of the IC chip is lowered. Consequently, when filling underfill material after an IC chip is mounted, the flow speed of the underfill material may become constant. Further, on the leveled surface of the solder-resist layer, by finely roughening at least the entire component mounting region so as not to increase the flow speed variation of the underfill material, adhesive strength between the solder-resist layer and the underfill may be enhanced.

The "electronic component mounting region" indicates a region casting the mounted electronic component from a vertically upward direction, namely, the region directly under the electronic component, substantially corresponding to the region where connection pads and conductive pads including via-holes are formed.

In a printed wiring board according to an embodiment of the present invention, for the resin to form a solder-resist layer, a commercially available solder-resist agent, for example, "RPZ-1" made by Hitachi Chemical Co., Ltd., "DPR-80SGT-7" made by Asahi Chemical Research Laboratory Co., Ltd., or "PSR-400 series" made by Taiyo Ink Mfg. Co., Ltd. may be used. The thickness of such a solder-resist layer is preferably made 5-40 µm: If too thin, a solder dam effect is lowered and if too thick, it is hard to develop.

A leveling treatment of the solder-resist layer surface according to an embodiment of the present invention is preferably conducted by following either (a) or (b):

(a) After a solder-resist composition is coated, before being dried or cured, or during a half-cured condition, the surface of the solder-resist layer is smoothed using a squeegee, blade, roll-coater, or spatula.

(b) After a solder-resist composition is coated or laminated, during a half-cured condition, or after being dried or cured, the surface of the solder-resist layer is pressed, or ground or polished.

If above (a) is employed, since no excess force is exerted on the substrate, stress is not accumulated in the substrate. Accordingly, tolerance to heat-cycle testing is improved and high-density is achieved.

On the other hand, if above (b) is employed, while either a coated or laminated solder-resist composition is half cured, or after it is dried or cured, on such a half-cured surface or cured surface, for example, a resin film such as PET is laminated. Then, it is preferred to apply pressure on the resin film to level the surface. Thermal pressing the surface of the solder-resist layer is more preferred, since leveling by pressure is easy.

The leveled surface of the solder-resist layer according to an embodiment of the present invention is preferably a roughened surface (hereinafter referred to as a "first roughened surface") having a maximum surface roughness in the range of 0.3-7.5 µm. More preferably, the maximum surface roughness of the first roughened surface is in the range of 0.8-3.0 µm.

If the maximum surface roughness of the first roughened surface is less than 0.3 µm, the wettability of the underfill material against the surface of the solder-resist layer is diminished, or the adhesive strength between the solder-resist layer and the underfill material is weakened; on the other hand, if the maximum surface roughness of the first roughened surface exceeds 7.5 µm, the flow speed of the underfill material varies.

The first roughened surface of the solder-resist layer having a maximum surface roughness in the range of 0.3-7.5 µm is preferably formed under conditions calling for pressing temperature: 35-100° C.; pressure: 1.0-10 MPa; and pressing time: 20 seconds to three (3) minutes.

If the pressing temperature is lower than 35° C. and the pressure is lower than 1.0 MPa and the pressing time is shorter than 20 seconds, then the maximum surface roughness of the solder-resist layer surface exceeds the preferred range; on the other hand, if the pressing temperature exceeds 100° C. and the pressure exceeds 10 MPa and the pressing time is longer than three (3) minutes, then due to excessive pressure, the solder-resist layer become too thin, causing decreased insulation reliability or degraded tolerance to impact.

Furthermore, according to an embodiment of the present invention, a roughened surface (hereinafter referred to as a "second roughened surface") formed on the leveled surface by a roughening treatment is preferably formed by a roughening treatment using an oxidation solution such as potassium permanganate or chromic acid, or a plasma process. That is because the roughened surface may be formed evenly.

Conditions for the above roughening treatment are preferred to be: for example, when using a potassium permanganate solution, concentration: 40-100 g/l; solution temperature: 40-80° C.; immersion time: 0.5-10 minutes; when using an oxygen plasma process, power: 400-1600 W; oxygen flow: 100-500 sccm; time: 10-300 seconds.

The surface roughness of the second roughened surface formed by the above roughening treatment is preferably less than the maximum surface roughness of the first roughened surface, and the arithmetic mean deviation (Ra) of the profile or roughness is preferred to be in the range of 0.2-0.7 µm. More preferably, the arithmetic mean deviation (Ra) of the profile or roughness of the second roughened surface is in the range of 0.2-0.5 µm.

If the arithmetic mean deviation (Ra) of the profile or roughness of the second roughened surface is less than 0.2 µm, adhesive strength between the underfill and solder-resist layer is weakened, and the wettability of the underfill material is decreased; on the other hand, if the arithmetic mean deviation (Ra) of the profile or roughness exceeds 0.7 µm, flux residue or cleaning solution residue remains in the concave portions, decreasing the insulation reliability or connection reliability.

On the surface of the solder-resist layer, it is preferred to form a first roughened surface having a predetermined maximum surface roughness by a leveling treatment, and a second roughened surface formed on the first roughened surface by a roughening treatment having a lower maximum surface roughness than that on the first roughened surface.

Figure 10:
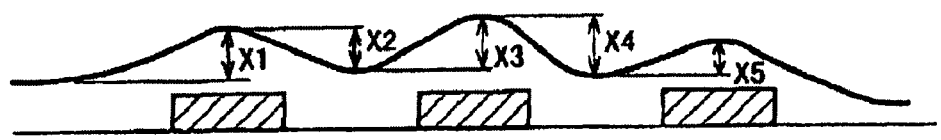
FIG. 10 is a schematic diagram showing a "maximum surface roughness" of the solder-resist layer surface.
Figure 11:
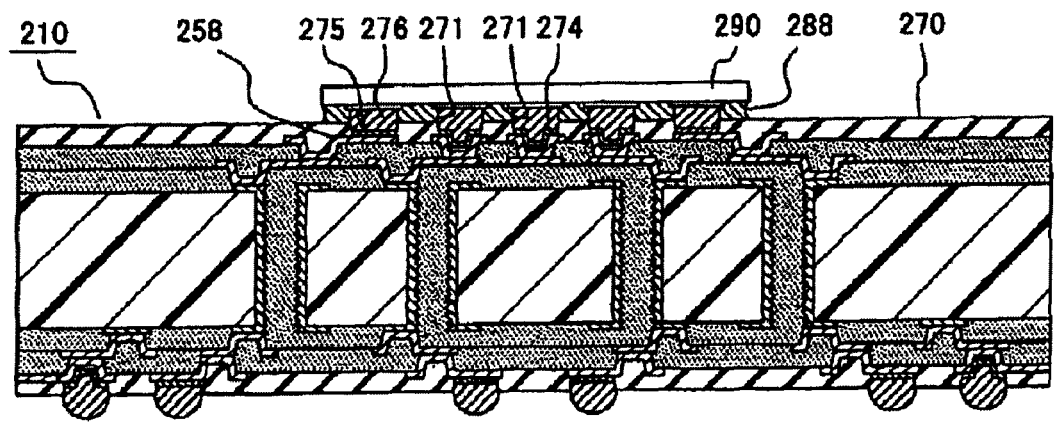
FIG. 11 is a cross-sectional view of a printed wiring board according to a background manufacturing method.

A "maximum surface roughness" of the first roughened surface indicates, as schematically shown in FIG. 10, in the electronic component mounting region, a maximum value among the height differences X1, X2, X3, X4, X5 . . . between the height of the solder-resist layer on the conductive pads or conductive circuit, and the height of the solder-resist layer on the adjacent portion where the conductive pads are not formed or where the conductive circuit is not formed.

Also, "arithmetic mean deviation of the profile or roughness" of the second roughened surface indicates an arithmetic mean deviation (Ra) of the profile or roughness regulated by the JIS.

As discussed above, the first roughened surface of the solder-resist layer is preferred to have a maximum surface roughness in the range of 0.3-7.5 μm, more preferably in the range of 0.8-3.0 μm. The second roughened surface of the solder-resist layer is preferred to have an arithmetic mean deviation (Ra) of the profile or roughness in the range of 0.2-0.7 μm. The leveled surface of the solder-resist layer may be roughened by immersing it in an oxidation solution such as potassium permanganate ($KMnO_4$) or chromic acid, or by a roughening process using a physical treatment such as $O_2$ plasma, Ar, $CF_4$ plasma or the like. The surface of the solder-resist layer is preferably leveled by a thermal pressing treatment. It is preferred to form a leveled surface by a thermal pressing treatment under conditions calling for pressing temperature: 35-100° C.; pressure: 1.0-10 MPa; pressing time: 20 seconds-three (3) minutes.

According to an embodiment of the present invention, on the leveled and roughened surface of the solder-resist layer, openings to expose portions of the conductive pads are formed using a usual method. As for the conductive circuit portions to function as conductive pads, either a configuration where a portion of the conductive circuit is partly exposed through an opening or a configuration where a portion of the conductive circuit is entirely exposed may be employed. If the former is employed, cracks at the resin insulation layer which occur at the boundary portions of conductive pads may be prevented, and if the latter is employed, tolerance to alignment gaps of the openings may be increased.

Also, "conductive pads" include a configuration structured with portions of the conductive circuit (a wiring pattern), a configuration structured with via holes (including filled vias completely filled with plating conductor in openings formed at resin insulation layers), and a configuration structured with portions of the conductive circuit in addition to via holes.

In a printed wiring board according to an embodiment of the present invention, the wiring substrate where a solder-resist layer will be formed is not limited to a certain type, but preferably is such that where the plating resist is formed on the roughened surface of resin insulation material, and on the portions where the plating resist is not formed, a conductive circuit including pads is formed; namely, a so-called additive or build-up printed wiring board is preferred.

When a solder-resist composition is coated on such a wiring substrate, the opening diameter of the solder-resist layer may be formed smaller than the conductive pad diameter. As a result, since the plating resist of a resin does not accept the solder but repels the solder, it works as a solder dam.

Also, in a printed wiring board according to an embodiment of the present invention, on the surface of a wiring substrate having a conductive circuit, a solder-resist layer is formed; conductive pads are formed using portions of the conductive circuit exposed through the openings formed in the solder-resist layer; on the conductive pads, solder bumps are formed; an electronic component is mounted via the solder bumps; and the space between the electronic component and the solder-resist layer is resin-sealed by underfill material.

On the surface of the solder-resist layer, at least in the electronic component mounting region, a leveling treatment is conducted, or on the leveled surface, a roughened surface by a roughening treatment is further formed.

The solder bumps are preferably formed using at least one solder selected from Sn/Pb, Sn/Sb, Sn/Ag, Sn/Ag/Cu, Sn/Cu and Sn/Zn. Namely, a solder selected from the above solders may be used singly, or in a combination of two or more.

Examples of such solders are: a tin/lead solder with a composition ratio of Sn:Pb=63:37, a tin/lead/silver solder with a composition ratio of Sn:Pb:Ag=62:36:2, or a tin/silver solder with a composition ratio of Sn:Ag=96.5:3.5.

Solder bumps are preferably formed by placing a mask having circular openings on the conductive pads and by using a printing method.

For solder to form solder bumps according to an embodiment of the present invention, almost all types of solder usually used when manufacturing a printed wiring board may be used singly or in combination thereof.

The height of the solder bumps is made in the range of 5-50 μm, and such a height and configuration are preferred to be uniform.

Also, the solder paste printed on the conductive pads is made into solder bumps by a reflow process. Such a reflow process is conducted under conditions using an inert gas such as nitrogen at temperatures in the range of 100-300° C. The reflow temperature is set at the most appropriate temperature range according to the melting point of the solder in use.

All the solder bumps formed by the above reflow process become almost hemispheric, and their heights are mostly uniform in the range of 5-50 μm. Accordingly, the solder-resist layer is not contaminated by the solder paste.

As for a method to connect an electronic component and solder bumps, there are methods such as conducting a reflow process while the electronic component and the wiring substrate are aligned, or heating and melting the solder bumps in advance and then connecting the electronic component and the wiring substrate.

Heating temperatures at their peak during the above procedure are preferably in the range of T° C., the melting point of solder bumps, to (T+50)° C. If the temperature is lower than T° C., the solder will not melt, and if it exceeds (T+50)° C., the melted solder may connect the adjacent solder bumps, causing a short circuit or degradation of the substrate.

According to an embodiment of the present invention, at the space between the mounted electronic component and the leveled surface of the solder-resist layer, or between the mounted electronic component and the leveled and roughened surface of the solder-resist layer, underfill material is filled and cured, accordingly the electronic component is resin-sealed.

Such underfill material filled between the mounted electronic component and the wiring substrate prevents mismatched thermal expansion rates of the electronic component and the wiring substrate. For example, on the solder-resist layer along a side of the electronic component, underfill material is potted using a nozzle. The potted resin is filled as it enters the space between the electronic component and the solder-resist layer.

For the above underfill material, thermo-setting resin, thermo-plastic resin, ultraviolet setting resin, photosensitive resin or the like may be used. For example, liquid resin such as epoxy resin, silicone resin, polyimide resin, phenol resin, fluoride resin, or inorganic filler dispersed-resins made by dispersing inorganic filler such as silica or alumina in the above resins, may be used.

Coefficients of viscosity of the above liquid resins are preferably in the range of 1.3-16 Pa·s at 25° C. If used in that range, the liquid resin is easy to fill.

Also, according to an embodiment of the present invention, a roughened surface is preferably formed on the entire surface of the conductive circuit. In a printed wiring board having such a structure, since the roughened surface formed on the conductive circuit including conductive pads (the portions to mount IC chips and electronic components) works as an anchor, the conductive circuit and the solder-resist layer adhere firmly. Also, adhesive strength with the solder provided on the conductive pad surfaces is enhanced. Further, on the pad surfaces, Ni/Au or Ni/Pd/Au is preferred to be applied.

Also, a method of manufacturing a printed wiring board according to an embodiment of the present invention, where a solder-resist layer is formed on a surface of a wiring substrate that has a conductive circuit, and portions of the conductive circuit exposed through the openings which are formed in the solder-resist layer are formed as conductive pads to mount an electronic component, includes at least the following steps (1)-(3):
(1) by coating a conductive circuit formed on an insulation layer, a step to form a solder-resist layer;
(2) after laminating a resin film on the surface of the solder-resist layer and by applying a thermal pressing treatment from above the resin film, a step to level the surface; and
(3) after removing the resin film and making openings in the leveled surface of the solder-resist layer, a step to form portions of the conductive circuit exposed through the openings as conductive pads.

A method of manufacturing a printed wiring board according to another embodiment of the present invention, where a solder-resist layer is formed on a surface of a wiring substrate that has a conductive circuit, portions of the conductive circuit exposed through the openings which are formed in the solder-resist layer are formed as conductive pads, solder bumps are formed on the solder pads, an electronic component is mounted via the solder bumps, and the electronic component is resin-sealed by an underfill, includes at least the following steps (1)-(6):
(1) by coating a conductive circuit formed on an insulation layer, a step to form a solder-resist layer;
(2) after laminating a resin film on the surface of the solder-resist layer and by applying a thermal pressing treatment from above the resin film, a step to level the surface;
(3) after removing the resin film and making openings in the leveled surface of the solder-resist layer, a step to form portions of the conductive circuit exposed through the openings as conductive pads;
(4) by filling a solder paste on the conductive pads, a step to form solder bumps;
(5) a step to mount an electronic component such as an IC on the wiring board via the solder bumps; and
(6) by filling underfill material between the mounted electronic component and the surface of the solder-resist layer, a step to resin-seal the electronic component.

A method of manufacturing a printed wiring board according to still another embodiment of the present invention, where a solder-resist layer is formed on a surface of a wiring substrate that has a conductive circuit, and portions of the conductive circuit exposed through the openings which are formed in the solder-resist layer are formed as conductive pads to mount an electronic component, includes at least the following steps (1)-(4):
(1) by coating a conductive circuit formed on an insulation layer, a step to form a solder-resist layer;
(2) after laminating a resin film on the surface of the solder-resist layer and by applying a thermal pressing treatment from above the resin film, a step to level the surface having a predetermined maximum surface roughness or lower;
(3) after removing the resin film and by applying a roughening treatment on the leveled surface, a step to form a roughened surface having an arithmetic mean deviation of the profile (Ra) smaller than the above maximum surface roughness; and
(4) after making openings in the surface of the solder-resist layer, a step to form portions of the conductive circuit exposed through the openings as conductive pads.

A method of manufacturing a printed wiring board according to still another embodiment of the present invention, where a solder-resist layer is formed on a surface of a wiring substrate that has a conductive circuit, portions of the conductive circuit exposed through the openings which are formed in the solder-resist layer are formed as conductive pads, solder bumps are formed on the solder pads, an electronic component is mounted via the solder bumps, and the space between the electronic component and the solder-resist layer is resin-sealed by an underfill, includes at least the following steps (1)-(7):
(1) by coating a conductive circuit formed on an insulation layer, a step to form a solder-resist layer;
(2) after laminating a resin film on the surface of the solder-resist layer and by applying a thermal pressing treatment from above the resin film, a step to level the surface having a predetermined maximum surface roughness or lower;
(3) after removing the resin film and by applying a roughening treatment on the leveled surface, a step to form a roughened surface having an arithmetic mean deviation of the profile (Ra) smaller than the above maximum surface roughness;
(4) after making openings in the leveled surface of the solder-resist layer, a step to form portions of the conductive circuit exposed through the openings as conductive pads;
(5) by filling a solder paste on the conductive pads, a step to form solder bumps;
(6) a step to mount an electronic component such as an IC on the wiring board via the solder bumps; and
(7) by filling underfill material between the mounted electronic component and the surface of the solder-resist layer, a step to resin-seal the electronic component.

In the methods to manufacture a printed wiring board described in the above, the thermal pressing treatment is preferably conducted under conditions calling for pressing temperature: 35-100° C.; pressure: 1.0-10 MPa; pressing time: 20 seconds-three (3) minutes.

Also, the roughening treatment is preferably conducted by immersion in a potassium permanganate solution at a concentration of 40-100 g/l and a solution temperature at 40-80° C. for 0.5-10 minutes, or by an oxygen plasma treatment under conditions calling for power: 400-1600 W; oxygen flow: 100-500 sccm; time: 10-300 seconds.

By leveling the surface of the solder-resist layer, the distance variation between the surface of the solder-resist layer and the bottom surface of the IC chip is reduced and thus the flow speed variation of the underfill material may be lowered. Accordingly, if electronic components such as an IC become large-sized, voids remaining in the underfill may be suppressed.

Also, by applying a roughening treatment on the leveled surface of the solder-resist layer, a roughened surface having an even finer roughness may be formed on the leveled surface. Accordingly, adhesive strength between the solder-resist layer and the underfill may be enhanced.

Therefore, between the solder-resist layer and the underfill, or between the underfill and the IC chip, cracks or separation may be prevented. Accordingly, degraded insulation resistance of the insulation layer made up of the solder-resist layer and the underfill, and increased connection resistance between the IC chip and the solder bumps caused by peeled substrates may be suppressed. Furthermore, since migration between solder bumps does not occur, short-circuiting between solder bumps may be prevented. As a result, a printed wiring board featuring excellent insulation and connection reliability may be provided.

EXAMPLES

Example 1

A printed wiring board and a method of manufacturing the same according to one embodiment of the present invention are described in reference to the drawings.

Figure 7:
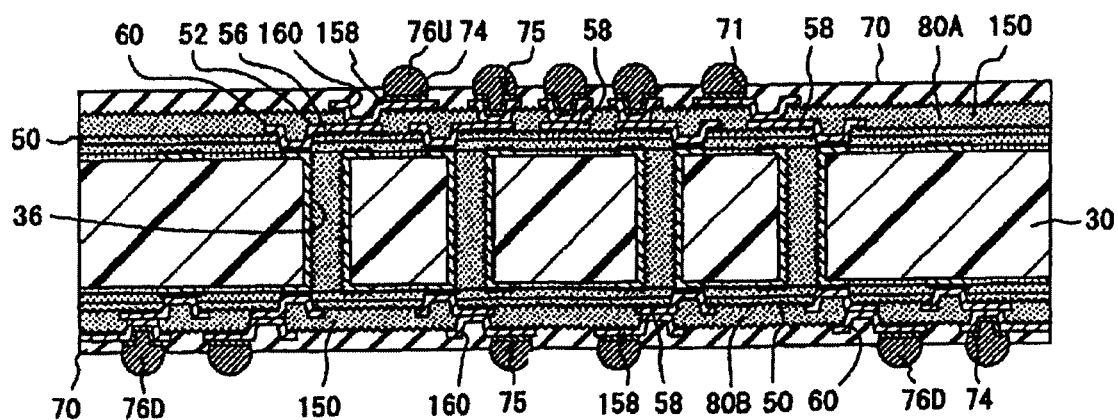
FIG. 7 is a cross-sectional view of a wiring board according to Example 1 of the present invention.
Figure 8:
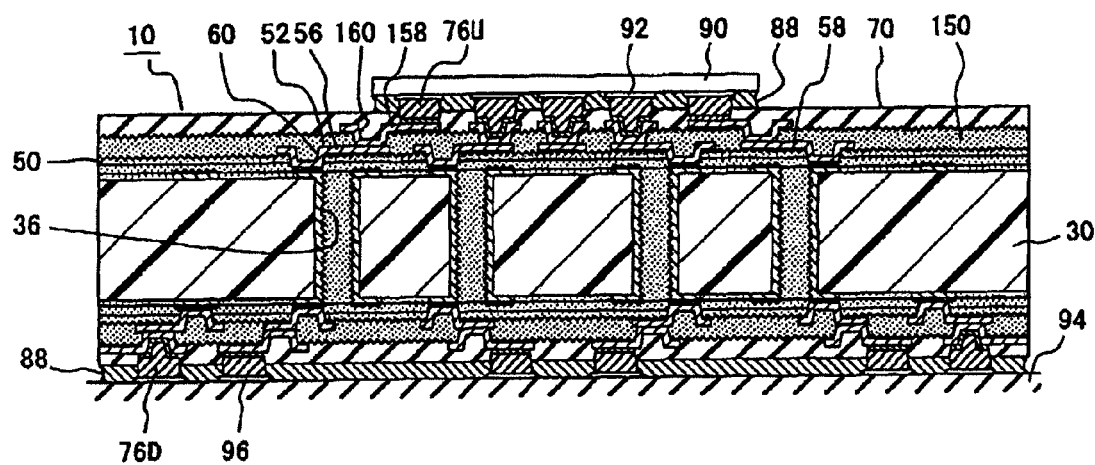
FIG. 8 is a cross-sectional view of a wiring board with a mounted IC chip according to Example 1 of the present invention.

FIG. 7 is a cross-sectional view of printed wiring board 10 (package substrate) before IC chip 90 as an electronic component is mounted. FIG. 8 is a cross-sectional view of printed wiring board 10 with mounted IC chip 90. As shown in FIG. 8, on the top surface of printed wiring board 10, IC chip 90 is mounted, and the bottom surface is connected to daughter board 94.

Printed wiring board 10 according to this embodiment is structured such that built-up wiring layers (80A, 80B) are formed separately on the top surface and bottom surface of core substrate 30. Built-up layer (80A) is structured with interlayer resin insulation layer 50, in which via holes 60 and conductive circuit 58 are formed, and interlayer resin insulation layer 150, in which via holes 160 and conductive circuit 158 are formed. Also, built-up wiring layer (80B) is structured with interlayer resin insulation layer 50, in which via holes 60 and conductive circuit 58 are formed, and interlayer resin insulation layer 150, in which via holes 160 and conductive circuit 158 are formed.

On the top surface of printed wiring board 10, solder bumps (76U) are formed to be connected to electrodes 92 (see FIG. 8) of IC chip 90. Solder bumps (76U) are connected to through-holes 36 through via holes 160 and via holes 60.

On the bottom surface of printed wiring board 10, solder bumps (76D) are formed to be connected to lands 96 (see FIG. 8) of daughter board (sub-board) 94. Solder bumps (76D) are connected to through-holes 36 through via holes 160 and via holes 60. Solder bumps (76U, 76D) are formed by filling solder on solder pads 75 which are formed by forming nickel-plated layers and gold-plated layers (those two layers are shown by numerical reference 74) on conductive circuit 158 and via holes 160 exposed through openings 71 in solder-resist layers 70.

As shown in FIG. 8, between printed wiring board 10 and IC chip 90, underfill material 88 is disposed for resin sealing. Also, between printed wiring board 10 and mother board 84, underfill material 88 is disposed.

The surfaces of solder-resist layers 70 on the top side of built-up layer (80A) and on the bottom side of built-up layer (80B) are leveled by thermal pressing as described later, and a maximum surface roughness of the leveled surfaces is made to be approximately 0.3 μm.

On the leveled surfaces, a roughening treatment is conducted using potassium permanganate, and a maximum surface roughness of the roughened surfaces is made to be approximately 0.25 μm and the arithmetic mean deviation (Ra) of the profile or roughness is approximately 0.2 μm.

By structuring so, the distance variation between the surface of solder-resist layer 70 and the bottom surface of IC chip 90 is decreased, and thus the flow speed of the underfill material 88 becomes constant. Accordingly, if IC chip 90 is large, voids remaining in underfill material 88 may be suppressed.

In addition, by roughening the leveled surface of solder-resist layers 70, adhesive strength between solder-resist layer 70 and underfill 88 may be improved.

Therefore, formation of cracks between solder-resist layer 70 and underfill 88 or between underfill 88 and IC chip 90 may be prevented.

Next, a method of manufacturing a printed wiring board shown in FIG. 7 is described as an example.

Figure 1B:
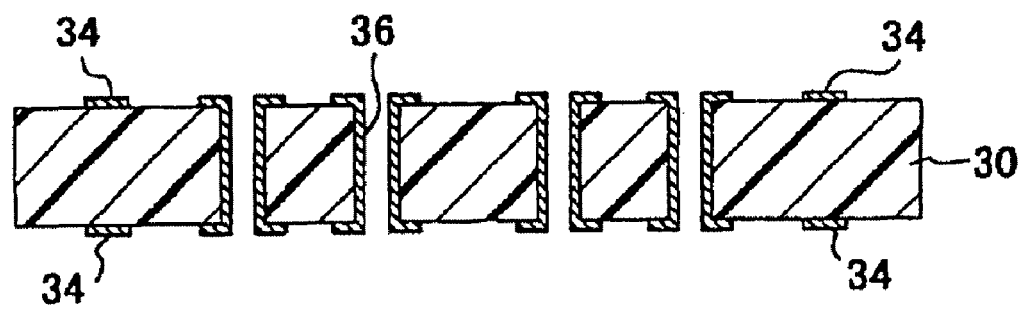

(A) First, the composition of source materials to make resin filler is prepared as follows:
[Resin Composition (1)]
Bisphenol F-type epoxy monomer (YL983U, molecular weight 310, made by Yuka Shell), 100 weight parts, $SiO_2$ spherical particles having an average particle diameter of 1.6 μm with coating of a silane coupling agent on the surfaces (CRS 1101-CE, made by Admatechs; here, the largest particle size is the same as or smaller than the thickness (15 μm) of the later-described inner-layer copper pattern) 170 weight parts, and a leveling agent (Perenol S4, made by San Nopco Ltd.) 1.5 weight parts are mixed and blended to adjust the viscosity of the mixture to the range 45,000-49,000 cps at 23±1° C.
[Curing Agent Composition (2)]
Imidazole curing agent (2E4MZ-CN, made by Shikoku Chemicals Corp.): 6.5 weight parts (B) Manufacturing a Printed Wiring Board (1) On both surfaces of substrate 30 made of one (1) mm-thick glass-epoxy resin or BT (bismaleimide-triazone) resin, 18 μm-thick copper foil 32 is laminated to form copper-laminated layer (30A) as a starting material (see FIG. 1(a)). After the above copper-laminated layer (30A) is drilled to form holes, an electroless plating treatment and an electrolytic plating treatment are performed, and further etched to form a pattern. Accordingly, on both surfaces of substrate 30, inner-layer copper patterns 34 and through-holes 36 are formed (see FIG. 1(b)).

Figure 1C:
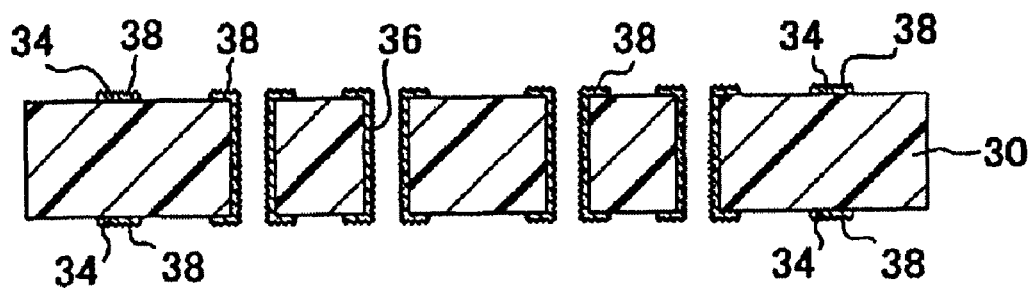

(2) After inner-layer copper patterns 34 and through-holes 36 were formed, substrate 30 was washed with water and dried. Then, for an oxide bath (black bath), using NaOH (10 g/l), $NaClO_2$ (40 g/l) and $Na_3PO_4$ (6 g/l), and for a reduction bath, using NaOH (10 g/l) and $NaBH_4$ (6 g/l), oxidation and reduction treatments are performed. Accordingly, on the surfaces of inner-layer copper pattern 34 and through-holes 34, roughened layers 38 are formed (see FIG. 1(c)).

(3) Resin composition of source materials (1) for resin filler and curing agent composition (2) as described in the above (A) are combined and blended and the resin filler is obtained.

Figure 1D:
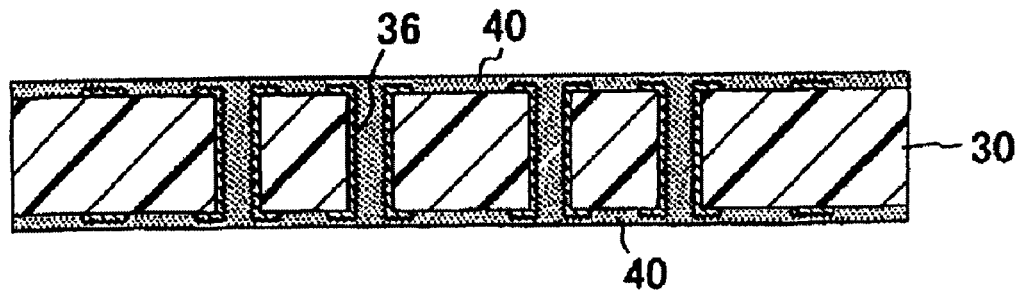

(4) Resin filler 40 obtained in above step (3) is coated on both surfaces of substrate 30 using a roll coater within 24 hours after the preparation, filled between conductive pattern (inner-layer copper pattern) 34 and conductive pattern 34 as well as inside through-holes 36, and thermo-dried under conditions of temperature at 70° C. and duration of 20 minutes (see FIG. 1(d)).

Figure 2A:
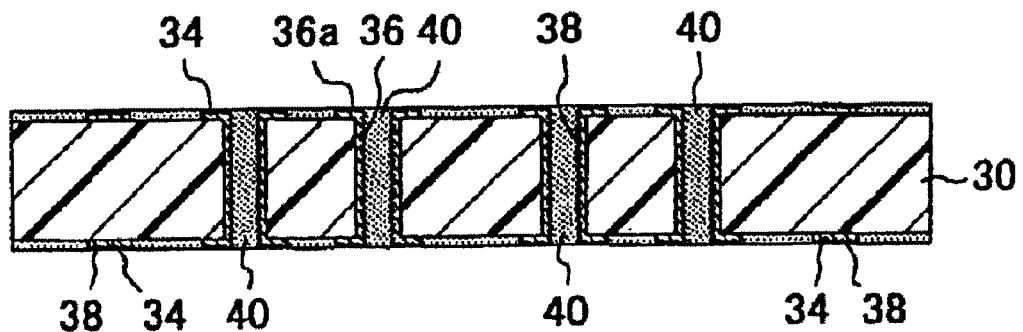
FIGS. 2(a)-2(c) are schematic views illustrating more steps of manufacturing a printed wiring board according to Example 1 of the present invention.

(5) One surface of substrate 30 after the treatment in above (4) is polished by a belt-sander using #600 belt-sanding paper (made by Sankyo-Rikagaku Co., Ltd.) so that resin filler 40 does not remain on the surfaces of inner-layer copper patterns 34 and lands (36a) of through-holes 36. Then, to remove scratches from belt-sander polishing, buff polishing is conducted. Such series of polishings are performed on the other surface of the substrate as well (see FIG. 2(a)). Then, at 100° C. for an hour, at 120° C. for three hours, at 150° C. for an hour and 180° C. for seven hours, a thermal treatment is conducted to cure resin filler 40. By doing so, top-layer portions of resin filler 40 filled in through-holes 36 and roughened surfaces 38 on top surfaces of inner-layer conductive circuits 34 are removed to level out both surfaces of substrate 30. Accordingly, a wiring substrate is obtained where resin filler 40 and side surfaces of inner-layer conductive circuits 34 are firmly adhered through roughened layers 38, and inner-wall surfaces of through-holes 36 and resin filler 40 are firmly adhered through roughened layers 38. Namely, by this step, the surface of resin filler 40 and the surface of inner-layer copper patterns 34 are leveled to be flush with each other.

Figure 2B:
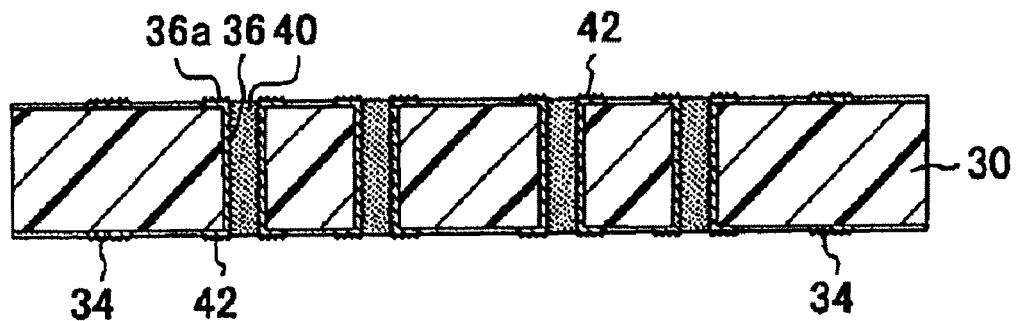
Figure 2C:
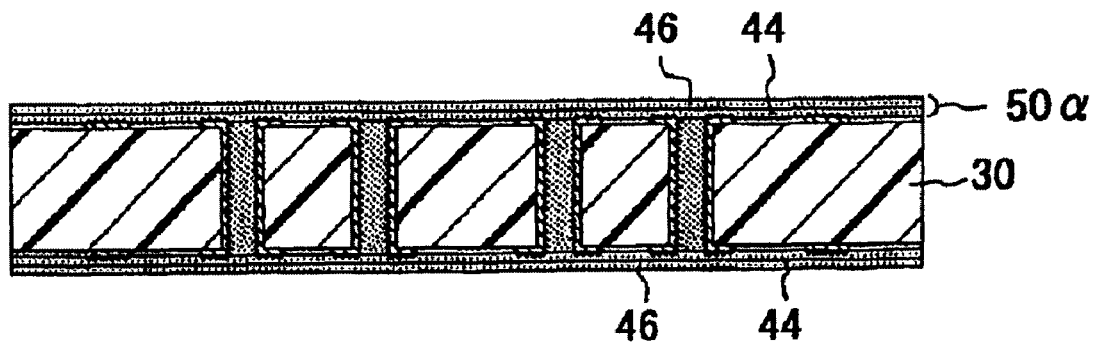
Figure 3A:
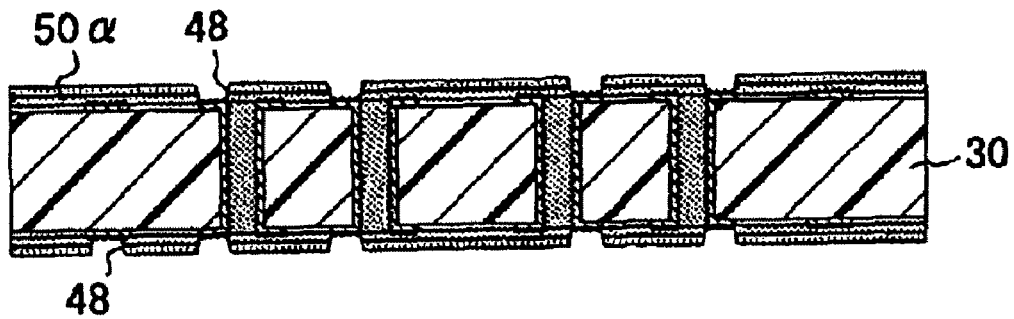
FIGS. 3(a)-3(d) are schematic views illustrating steps of manufacturing a printed wiring board according to Example 1 of the present invention.
Figure 3B:
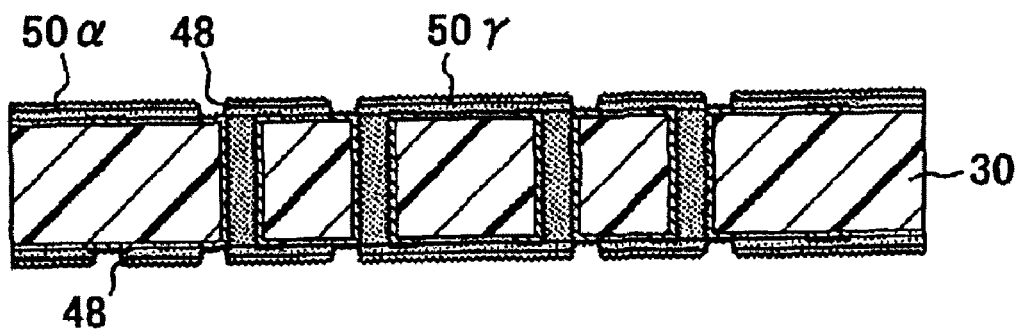
Figure 3C:
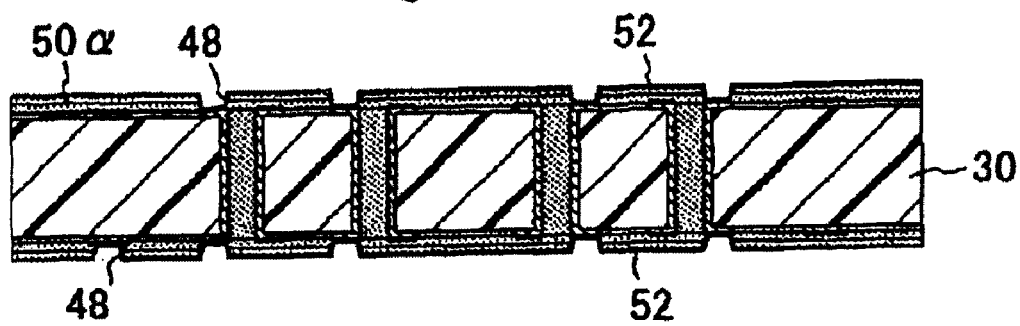
Figure 3D:
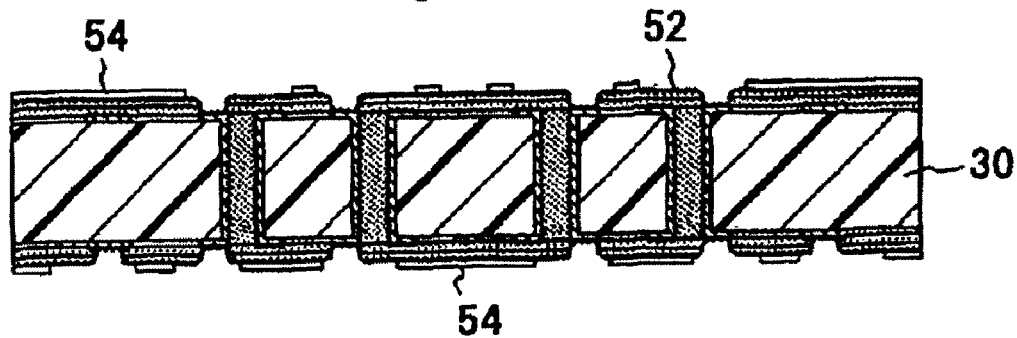
Figure 4A:
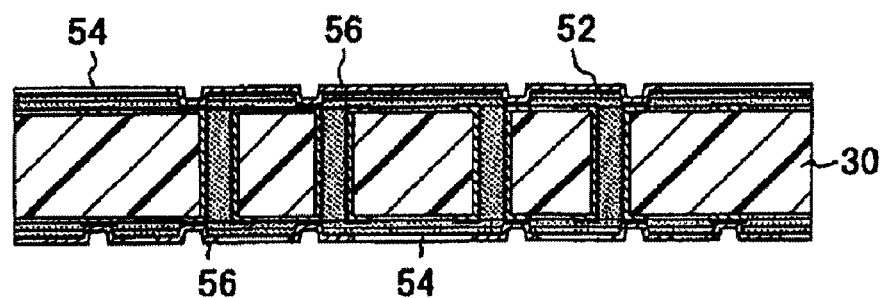
FIGS. 4(a)-4(d) are schematic views illustrating steps of manufacturing a printed wiring board according to Example 1 of the present invention.
Figure 4B:
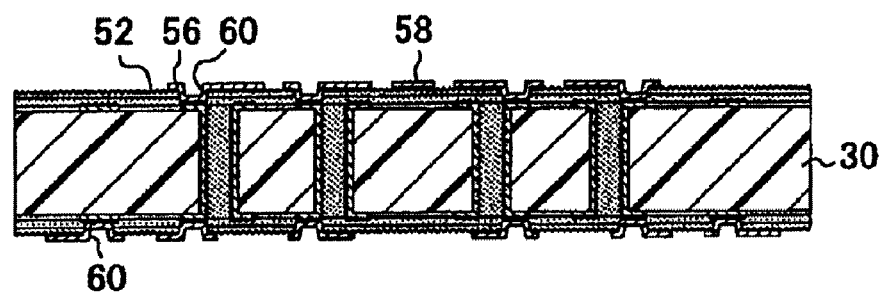
Figure 4C:
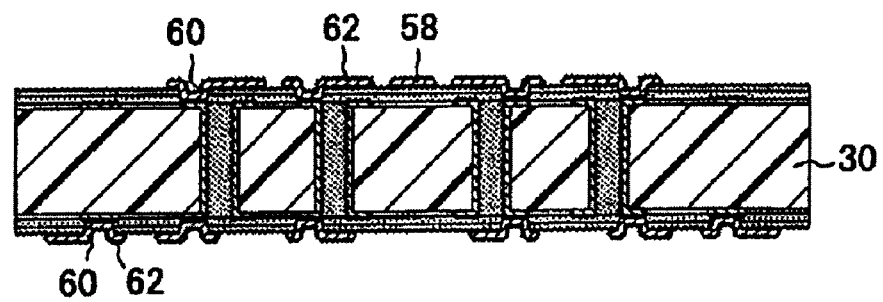
Figure 4D:
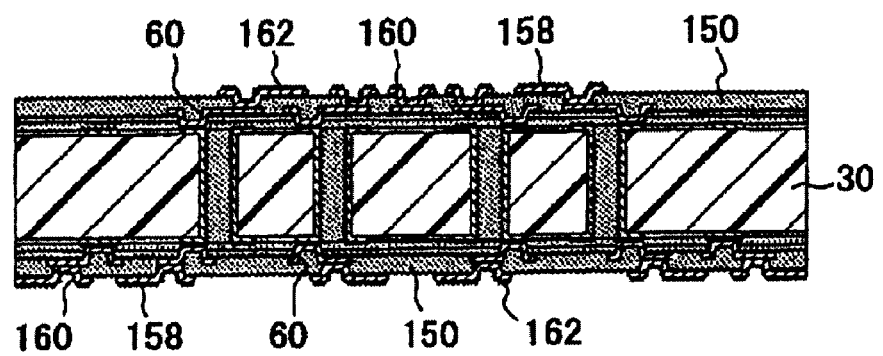

(6) Next, a copper-surface roughening agent (Cz-8100, Etchbond Cz series, made by Mec Co., Ltd.) is sprayed on the substrate to form roughened surfaces 42 on the surfaces of conductive circuits 34 and lands (36*a*) of through-holes 36 (see FIG. 2(*b*)).

(7) On both surfaces of the substrate, a resin film to make interlayer resin insulation layers (ABF-45SH made by Ajinomoto Co. Inc.), which is slightly larger than the substrate, is placed, preliminarily pressed under conditions calling for pressure of 0.45 MPa, temperature of 80° C. and pressing time of 10 seconds, cut out, and then laminated using vacuum laminator equipment by the below method. Accordingly, interlayer resin insulation layers (50α) are formed (see FIG. 2(*c*)). Namely, resin films to make interlayer resin insulation layers are pressed on the substrate under conditions calling for vacuum degree of 67 Pa, pressure of 0.47 MPa, temperature of 85° C. and pressing time of 60 seconds, and then heated at 170° C. for 40 minutes to thermo-set the film.

(8) Next, using a $CO_2$ gas laser with a 10.4-μm wavelength under conditions calling for beam diameter of 4.0 mm, top-hat mode, pulse width of 3-30 μsec., mask through-hole diameter of 1.0-5.0 mm, and number of shots 1-3, on interlayer resin insulation layers (50α), via-hole openings 48 with an 85 μmΦ are formed (see FIG. 3(*a*)).

(9) After via-hole openings 48 are formed, by immersing the substrate in an 80° C.-solution containing potassium permanganate 60 g/l for 10 minutes, inorganic particles left on the surfaces of interlayer resin insulation layers (50α) are removed. Accordingly, on the surfaces of interlayer resin insulation layers (50α) including the inner walls of via-hole openings 48, roughened surfaces (50γ) are formed (see FIG. 3(*b*)).

(10) Next, after the above treatment the substrate is immersed in a neutralizer solution (made by Shipley Company L.L.C.) and washed with water. Furthermore, on the roughened surface (roughness depth of 3 μm) of the substrate, a palladium catalyst is applied, and catalytic nuclei are adhered on the surfaces of the interlayer resin insulation layers and the inner walls of via-hole openings 48. Namely, the above substrate is immersed in a catalytic solution containing palladium chloride ($PdCl_2$) and stannous chloride ($SnCl_2$) and by precipitating palladium metal, a catalyst is applied.

(11) Next, in electroless copper plating solution (Thrucup PEA made by C. Uyemura & Co., Ltd.), the substrate with adhered catalyst is immersed, and an electroless copper-plated film with a thickness in the range of 0.3-3.0 μm is formed on the entire roughened surface. Accordingly, a substrate having electroless copper-plated films 52 formed on the surfaces of interlayer resin insulation layers (50α) including the inner walls of via-hole openings 48 is obtained (FIG. 3(*c*)).

[Electroless Plating Conditions]
Solution Temperature at 34° C. for 45 Minutes

(12) On electroless copper plated films 52 formed in the above (11), a commercially available photosensitive dry film is laminated, on which a mask is placed, then exposed to light at 100 mJ/$cm^2$ and developed in a 0.8%-sodium carbonate solution to form 15 μm-thick plating resists 54 (see FIG. 3(*d*)).

(13) Then, at the portions where the resist is not formed, electrolytic copper plating is performed under the following conditions to form electrolytic copper plated films 56 with a thickness of 15 μm (see FIG. 4(*a*)).

| [electrolytic plating solution] | |
| --- | --- |
| sulfuric acid: | 180 g/l |
| copper sulfate: | 80 g/l |
| additive: | 1 ml/l |

(Cupracid GL, made by Atotech Japan)

| [electrolytic plating conditions] | |
| --- | --- |
| current density: | 1 A/$dm^2$ |
| time: | 30 minutes |
| temperature: | room temperature |

(14) After removing plating resists 54 using a 5%-KOH solution, electroless plated films 52 under the plating resists are removed by an etching treatment using a mixed solution of sulfuric acid and hydrogen peroxide. Accordingly, 18 μm-thick conductive circuits 58 and via holes 60, which are made of electroless copper plated films 52 and electrolytic copper plated films 56, are formed (FIG. 4(*b*)).

(15) The same treatment as in (6) is conducted, and roughened surfaces 62 are formed on the surfaces of conductive circuits 58 and via holes 60 (see FIG. 4(*c*)).

(16) By repeating the steps (7)-(15), after interlayer resin insulation layers 150 are formed as further upper layers, conductive circuits 158 and via holes 160 are formed. Accordingly, a multilayered wiring board is obtained (see FIG. 4(*d*)).

(17) On one surface of substrate 30 obtained in above (16), a commercially available solder-resist ink was screen-printed under the below printing conditions.

| [printing conditions] | |
| --- | --- |
| solder-resist ink: | brand name "RPZ-1" made by Hitachi Chemical Co., Ltd. |
| screen plate: | made of polyester fiber |
| squeegee speed: | 100-200 mm/sec. |

Figure 5A:
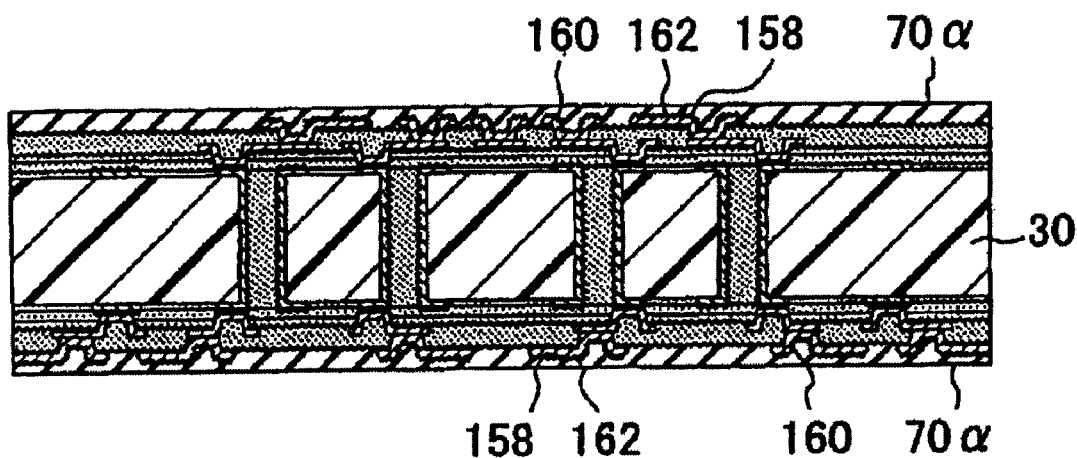
FIGS. 5(a)-5(b) are schematic views illustrating steps of manufacturing a printed wiring board according to Example 1 of the present invention.
Figure 5B:
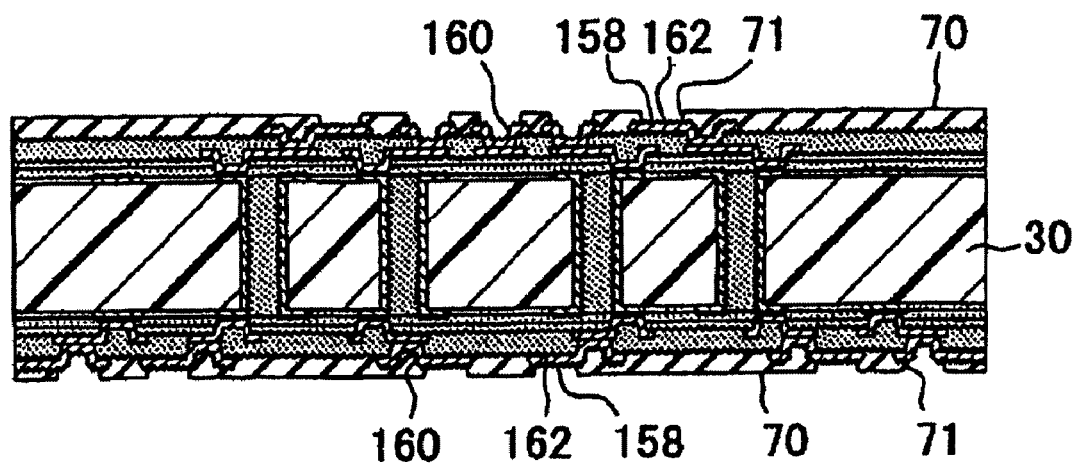
Figure 9A:
FIG. 9(a) is a schematic diagram showing the roughness of a solder-resist layer surface before a leveling treatment is conducted on a printed wiring board according to Example 1 of the present invention.
Figure 9B:
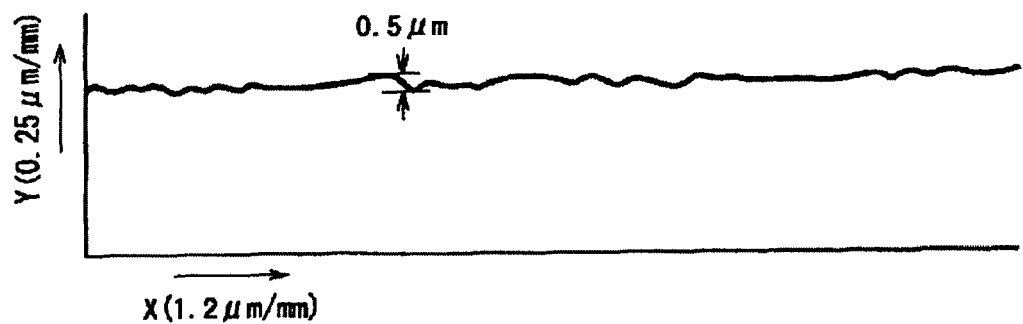
FIG. 9(b) is another schematic diagram showing the roughness of a solder-resist layer surface after a leveling treatment is conducted.
Figure 9C:
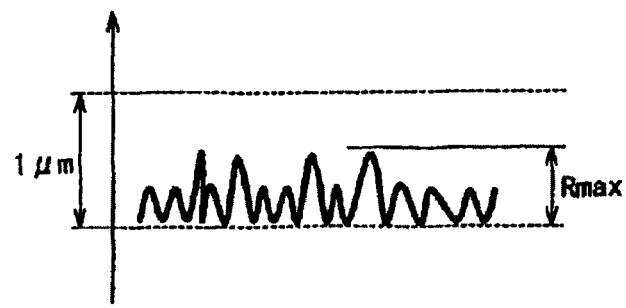
FIG. 9(c) is yet another schematic diagram showing the roughness of a solder-resist layer surface after a roughening treatment is conducted.

After screen-printing, the ink is dried at 50° C. for 10 minutes, then the solder-resist ink is printed on the other surface under the same conditions and dried at 60-70° C. for 20-25 minutes to form semi-cured solder-resist layers 70 (see FIG. 5(*a*)). On the surface of solder-resist layer 70, in a later-described conductive pad-mounting region to mount an IC chip (area of the region: 40 $mm^2$, number of conductive pads: 1,000), the roughness caused by the presence of the conductive circuit is measured using a surface roughness tester (for example, brand name "SURFCOM 480A" made by Tokyo Seimitsu Co., Ltd., or brand name "WYKO NT-2000" made by Veeco Instruments). Then, the degree of surface roughness is checked at 10 points and a maximum value is indicated as a maximum surface roughness. Namely, as shown in FIG. 10, points are selected where X1, X2, . . . can be measured. The result is schematically shown in FIG. 9(*a*). As indicated in the diagram, the surfaces of solder-resist layers 70 after the solder-resist ink is coated and dried show relatively substantial roughness with a maximum surface roughness of approximately 10 μm.

(18) Then, on both surfaces of solder-resist layers 70 formed in above (17), a PET film is laminated. And under the conditions below for a leveling treatment, the solder-resist layers are pressed through the PET films and the surfaces of the solder-resist layers are leveled.

| [conditions for leveling treatment] | |
| --- | --- |
| pressure temperature: | 80° C. |
| pressure: | 5 MPa |
| pressing time: | two (2) minutes |

On the surfaces of solder-resist layers 70 after the leveling treatment, the same points as measured in above (17) are measured by the same surface roughness tester to check the roughness degree of the solder-resist layers after the leveling treatment. The result is schematically shown in FIG. 9(*b*). As indicated by the diagram, the surfaces of solder-resist layers 70, on which a leveling treatment is conducted after the solder-resist ink is coated and dried, have roughness with a maximum surface roughness of approximately 0.3 μm.

(19) On the surfaces of solder-resist layers 70 formed in above (18), a 5 mm-thick photo-mask film (not shown in the drawing) with a printed circular pattern (mask pattern) is placed and adhered, and the surface is exposed to ultra-violet light at 1,000 mJ/cm$^2$, developed in a solution containing 10 g/l sodium carbonate ($Na_2CO_3$), then thermo-dried under conditions of 80° C. for an hour, 100° C. for an hour, 120° C. for an hour and 150° C. for three hours. Accordingly, solder-resist layers 70 (thickness: 20 μm) having openings (opening diameter: 80 μm) corresponding to where conductive pads (including via-holes and their lands) are formed (see FIG. 5(*b*)). In this example, in the region where conductive pads for mounting an IC chip (area of the region: 4 mm×10 mm=40 mm$^2$), 1,000 conductive pads having an opening diameter of 80 μm are formed.

Figure 6A:
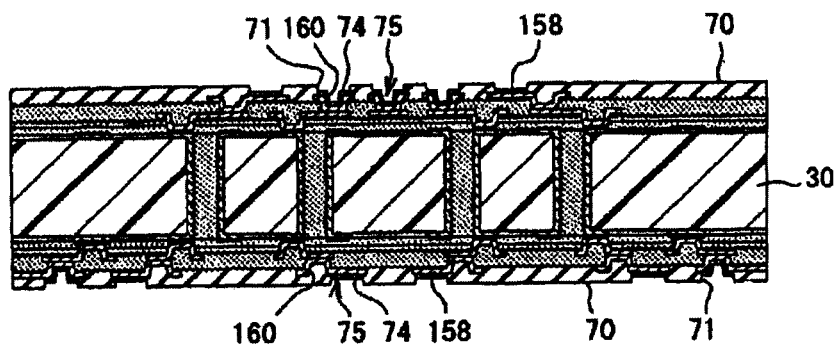
FIGS. 6(a)-6(b) are schematic views illustrating steps of manufacturing a printed wiring board according to Example 1 of the present invention.
Figure 6B:
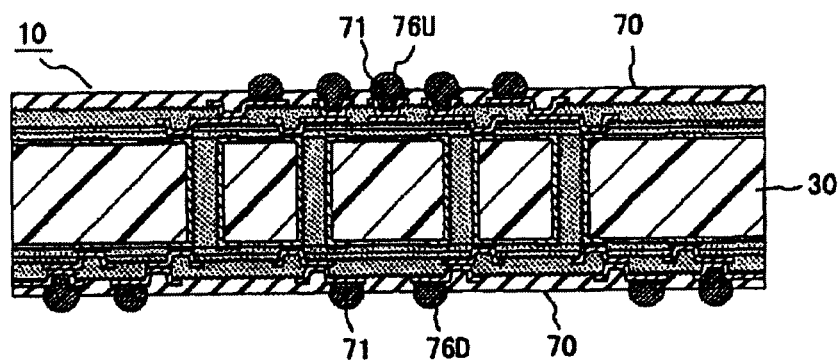

(20) In an electroless nickel plating solution at pH=4.5, containing nickel chloride (2.31×10$^{-2}$ mol/l), sodium hypophosphite (2.84×10$^{-1}$ mol/l) and sodium citrate (1.55×10$^{-1}$ mol/l), substrate 30 is immersed for 20 minutes. Accordingly, 5 μm-thick nickel-plated layers are formed on the surfaces of conductive circuits 158 and via holes 160 exposed through openings 71. Moreover, in an electroless gold plating solution, containing gold potassium cyanide (7.61×10$^{-3}$ mol/l), ammonium chloride (1.87×10$^{-1}$ mol/l), sodium citrate (1.16×10$^{-1}$ mol/l) and sodium hypophosphite (1.70×10$^{-1}$ mol/l), the above substrate is immersed for seven minutes and 20 seconds under the condition of 80° C. Accordingly, by forming a 0.03 μm-thick gold-plated layer on top of the nickel-plated layer (nickel-plated layer and gold-plated layer are indicated by numerical reference 74), on the surfaces of via holes 160 and conductive circuits 158, conductive pads 75 are formed (see FIG. 6(*a*)).

(21) Then, on solder-resist layers 70, a metal mask is placed and a solder paste is printed by a printing method. After the metal mask is removed, by reflowing at 200° C., solder bumps (solder) (76U, 76D) are formed on conductive pads 75 exposed through openings 71. Accordingly, printed wiring board 10 is obtained (see FIG. 6(*b*)).

(22) Next, IC chip 90 is mounted by aligning electrodes 92 of IC chip 90 with solder bumps (76U) on the printed wiring board obtained in above (22). Then, by a reflow process, IC chip 90 is installed.

(23) After that, in the space between IC 90 and the solder-resist layer of printed wiring board 10, a commercially available underfill material (resin sealing), (for example, E-1172A made by Emerson & Cuming Co.) is filled and underfill 88 is formed to resin-seal the above space. At that time, it is preferred to heat the substrate to a temperature at which underfill 88 is not cured. Afterward, underfill 88 is cured. In the same manner, by reflowing, daughter board 94 is installed on solder bumps (76D) of printed wiring board 10 and then by using a commercially available underfill material, underfill 88 is formed. Lastly, by curing underfill 88, printed wiring board 10 is completed with mounted electronic components such as an IC chip.

Example 2

The area of the region in the solder-resist layer (electronic component mounting region) corresponding to the region (area C4) where conductive pads for mounting an IC chip were formed was set at 70 mm$^2$, and the number of conductive pads formed in the mounting region was 2,000 (the same as the number of electrodes in the IC chip). With that exception, a printed wiring board was produced in the same way as in Example 1. The surface of the electronic component mounting region in this example was roughened to a maximum roughness of 0.5 μm.

Example 3

The area of the region in the solder-resist layer (electronic component mounting region) corresponding to the region (area C4) where conductive pads for mounting an IC chip were formed was set at 130 mm$^2$, and the number of conductive pads formed in the mounting region was 4,000. With that exception, a printed wiring board is produced in the same way as in Example 1. The surface of the electronic component mounting region in this example was roughened to a maximum roughness of 0.4 μm.

Example 4

The area of the region in the solder-resist layer (electronic component mounting region) corresponding to the region (area C4) where conductive pads for mounting an IC chip were formed was set at 310 mm$^2$, and the number of conductive pads formed in the mounting region was 10,000. With that exception, a printed wiring board is produced in the same way as in Example 1. The surface of the electronic component mounting region in this example was roughened to a maximum roughness of 0.5 μm.

Example 5

The area of the region in the solder-resist layer (electronic component mounting region) corresponding to the region (area C4) where conductive pads for mounting an IC chip were formed was set at 900 mm$^2$, and the number of conductive pads formed in the mounting region was 30,000. With that exception, a printed wiring board was produced in the same way as in Example 1. The surface of the electronic component mounting region in this example was roughened to a maximum roughness of 0.5 μm.

Example 6

The pressing temperature when leveling the solder-resist layers was set at 60° C. With that exception, a printed wiring board was produced in the same manner as in Example 1. The surface of the electronic component mounting region in this example was roughened to a maximum roughness of 0.7 μm.

Example 7

The pressing temperature when leveling the solder-resist layers was set at 60° C. With that exception, a printed wiring board was produced in the same manner as Example 2. The surface of the electronic component mounting region in this example was roughened to a maximum roughness of 0.8 μm.

Example 8

The pressing temperature when leveling the solder-resist layers was set at 60° C. With that exception, a printed wiring board was produced in the same manner as in Example 3. The surface of the electronic component mounting region in this example was roughened to a maximum roughness of 0.8 μm.

Example 9

The pressing temperature when leveling the solder-resist layers was set at 60° C. With that exception, a printed wiring board was produced in the same manner as in Example 4. The surface of the electronic component mounting region in this example was roughened to a maximum roughness of 0.7 μm.

Example 10

The pressing temperature when leveling the solder-resist layers was set at 60° C. With that exception, a printed wiring board was produced in the same manner as in Example 5. The surface of the electronic component mounting region in this example was roughened to a maximum roughness of 0.8 μm.

Example 11

The pressure when leveling the solder-resist layers was set at 3 MPa. With that exception, a printed wiring board was produced in the same manner as in Example 1. The surface of the electronic component mounting region in this example was roughened to a maximum roughness of 2.0 μm.

Example 12

The pressure when leveling the solder-resist layers was set at 3 MPa. With that exception, a printed wiring board was produced in the same manner as in Example 2. The surface of the electronic component mounting region in this example was roughened to a maximum roughness of 2.0 μm.

Example 13

The pressure when leveling the solder-resist layers was set at 3 MPa. With that exception, a printed wiring board was produced in the same manner as in Example 3. The surface of the electronic component mounting region in this example was roughened to a maximum roughness of 2.0 μm.

Example 14

The pressure when leveling the solder-resist layers was set at 3 MPa. With that exception, a printed wiring board was produced in the same manner as in Example 4. The surface of the electronic component mounting region in this example was roughened to a maximum roughness of 2.1 μm.

Example 15

The pressure when leveling the solder-resist layers was set at 3 MPa. With that exception, a printed wiring board was produced in the same manner as in Example 5. The surface of the electronic component mounting region in this example was roughened to a maximum roughness of 2.2 μm.

Example 16

The pressure when leveling the solder-resist layers was set at 1 MPa. With that exception, a printed wiring board was produced in the same manner as in Example 1. The surface of the electronic component mounting region of this example was roughened to a maximum roughness of 4.8 μm.

Example 17

The pressure when leveling the solder-resist layers was set at 1 MPa. With that exception, a printed wiring board was produced in the same manner as in Example 2. The surface of the electronic component mounting region in this example was roughened to a maximum roughness of 4.7 μm.

Example 18

The pressure when leveling the solder-resist layers was set at 1 MPa. With that exception, a printed wiring board was produced in the same manner as in Example 3. The surface of the electronic component mounting region in this example was roughened to a maximum roughness of 5.0 μm.

Example 19

The pressure when leveling the solder-resist layers was set at 1 MPa. With that exception, a printed wiring board was produced in the same manner as in Example 4. The surface of the electronic component mounting region in this example was roughened to a maximum roughness of 4.9 μm.

Example 20

The pressure when leveling the solder-resist layers was set at 1 MPa. With that exception, a printed wiring board was produced in the same manner as in Example 5. The surface of the electronic component mounting region in this example was roughened to a maximum roughness of 5.0 μm.

Example 21

The pressure when leveling the solder-resist layers was set at 1 MPa and the pressing temperature at 60° C. With that exception, a printed wiring board was produced in the same manner as in Example 1. The surface of the electronic component mounting region in this example was roughened to a maximum roughness of 7.0 μm.

Example 22

The pressure when leveling the solder-resist layers was set at 1 MPa and the pressing temperature at 60° C. With that exception, a printed wiring board was produced in the same manner as in Example 2. The surface of the electronic component mounting region in this example was roughened to a maximum roughness of 7.2 μm.

Example 23

The pressure when leveling the solder-resist layers was set at 1 MPa and the pressing temperature at 60° C. With that exception, a printed wiring board was produced in the same manner as in Example 3. The surface of the electronic component mounting region in this example was roughened to a maximum roughness of 7.3 μm.

Example 24

The pressure when leveling the solder-resist layers was set at 1 MPa and the pressing temperature at 60° C. With that exception, a printed wiring board was produced in the same manner as in Example 4. The surface of the electronic component mounting region in this example was roughened to a maximum roughness of 7.5 μm.

Example 25

The pressure when leveling the solder-resist layers was set at 1 MPa and the pressing temperature at 60° C. With that exception, a printed wiring board was produced in the same manner as in Example 5. The surface of the electronic component mounting region in this example was roughened to a maximum roughness of 7.5 μm.

Example 26

On the leveled surface of solder-resist layers 70 formed according to step (18) in Example 1, a roughening treatment was conducted using a potassium permanganate solution under the below conditions to roughen the solder-resist layer surfaces. With that exception, a printed wiring board was produced in the same manner as in Example 1.

| [conditions for roughening treatment] | |
| --- | --- |
| roughening solution: | potassium permanganate solution |
| concentration: | 60 g/l |
| solution temperature: | 60° C. |
| immersion time: | one (1) minute |

On the roughened surface of solder-resist layer 70, limited areas among the regions measured in step (18) of Example 1 were measured using the same surface roughness tester, and the roughness of the solder-resist layer surface after the roughening treatment was checked. The result is schematically shown in FIG. 9(*c*). However, the measured points were portions of the solder-resist layer surface corresponding to the area where a conductive circuit (pads) was formed and also the portions of the solder-resist layer surface corresponding to the area where a conductive circuit was not formed. The boundary areas between the region where a conductive circuit was formed and the region where a conductive circuit was not formed were not measured. From the diagram, it is found that the roughened surface formed on the leveled surface is roughened to a maximum surface roughness (Rmax: see FIG. 9(*c*)) of 0.25 μm, and an arithmetic mean deviation (Ra) of the profile or roughness is approximately 0.2 μm.

Example 27

The area of a region in the solder-resist layer (electronic component mounting region) corresponding to the region (area C4) where conductive pads for mounting an IC chip were formed was set at 70 mm$^2$, and the number of conductive pads formed in the mounting region was 2,000 (the same as the number of electrodes in the IC chip). With that exception, a printed wiring board was produced in the same way as in Example 26. The leveled surface in the electronic component mounting region in this example was formed to have a maximum surface roughness of 0.5 μm; and the roughened surface was formed to have a maximum surface roughness of 0.25 μm and an arithmetic mean deviation of the profile (Ra) of approximately 0.2 μm.

Example 28

The area of a region in the solder-resist layer (electronic component mounting region) corresponding to the region (area C4) where conductive pads for mounting an IC chip were formed was set at 130 mm$^2$, and the number of conductive pads formed in the mounting region was 4,000. With that exception, a printed wiring board was produced in the same way as in Example 26. The leveled surface in the electronic component mounting region in this example was formed to have a maximum surface roughness of 0.4 μm; and the roughened surface was formed to have a maximum surface roughness of 0.25 μm and an arithmetic mean deviation (Ra) of the profile or roughness of approximately 0.2 μm.

Example 29

The area of a region in the solder-resist layer (electronic component mounting region) corresponding to the region (area C4) where conductive pads for mounting an IC chip were formed was set at 310 mm$^2$, and the number of conductive pads formed in the mounting region was 10,000. With that exception, a printed wiring board was produced in the same way as in Example 26. The leveled surface in the electronic component mounting region in this example was formed to have a maximum surface roughness of 0.5 μm; and the roughened surface was formed to have a maximum surface roughness of 0.25 μm and an arithmetic mean deviation (Ra) of the profile or roughness of approximately 0.2 μm.

Example 30

The area of a region in the solder-resist layer (electronic component mounting region) corresponding to the region (area C4) where conductive pads for mounting an IC chip were formed was set at 1,200 mm$^2$, and the number of conductive pads formed in the mounting region was 30,000. With that exception, a printed wiring board was produced in the same way as in Example 26. The leveled surface in the electronic component mounting region in this example was formed to have a maximum surface roughness of 0.5 μm; and the roughened surface was formed to have a maximum surface roughness of 0.25 μm and an arithmetic mean deviation (Ra) of the profile or roughness of approximately 0.2 μm.

Example 31

The pressing temperature when leveling the solder-resist layers was set at 60° C. and the immersion time to roughen the leveled surfaces was 1.5 minutes. With that exception, a printed wiring board was produced in the same manner as in Example 26. The leveled surface in the electronic component mounting region in this example was formed to have a maximum surface roughness of 0.7 μm; and the roughened surface was formed to have a maximum surface roughness of 0.4 μm and an arithmetic mean deviation (Ra) of the profile or roughness of approximately 0.3 μm.

Example 32

The pressing temperature when leveling the solder-resist layers was set at 60° C. and the immersion time to roughen the leveled surfaces was 1.5 minutes. With that exception, a printed wiring board was produced in the same manner as in Example 27. The leveled surface in the electronic component mounting region in this example was formed to have a maximum surface roughness of 0.8 μm; and the roughened surface was formed to have a maximum surface roughness of 0.4 μm and an arithmetic mean deviation (Ra) of the profile or roughness of approximately 0.3 μm.

Example 33

The pressing temperature when leveling the solder-resist layers was set at 60° C. and the immersion time to roughen the leveled surfaces was 1.5 minutes. With that exception, a printed wiring board was produced in the same manner as in Example 28. The leveled surface in the electronic component mounting region in this example was formed to have a maximum surface roughness of 0.8 μm; and the roughened surface was formed to have a maximum surface roughness of 0.4 μm and an arithmetic mean deviation (Ra) of the profile or roughness of approximately 0.3 μm.

Example 34

The pressing temperature when leveling the solder-resist layers was set at 60° C. and the immersion time to roughen the leveled surfaces was 2.0 minutes. With that exception, a printed wiring board was produced in the same manner as in Example 29. The leveled surface in the electronic component mounting region in this example was formed to have a maximum surface roughness of 0.7 μm; and the roughened surface was formed to have a maximum surface roughness of 0.45 μm and an arithmetic mean deviation (Ra) of the profile or roughness of approximately 0.4 μm.

Example 35

The pressing temperature when leveling the solder-resist layers was set at 60° C. and the immersion time to roughen the leveled surfaces was 2.5 minutes. With that exception, a printed wiring board was produced in the same manner as in Example 30. The leveled surface in the electronic component mounting region in this example was formed to have a maximum surface roughness of 0.8 μm; and the roughened surface was formed to have a maximum surface roughness of 0.55 μm and an arithmetic mean deviation (Ra) of the profile or roughness of approximately 0.5 μm.

Example 36

The pressure when leveling the solder-resist layers was set at 3 MPa and the immersion time to roughen the leveled surfaces was 2.0 minutes. With that exception, a printed wiring board was produced in the same manner as in Example 26. The leveled surface in the electronic component mounting region in this example was formed to have a maximum surface roughness of 3.0 μm; the roughened surface was formed to have a maximum surface roughness of 0.45 μm and an arithmetic mean deviation (Ra) of the profile or roughness of approximately 0.35 μm.

Example 37

The pressure when leveling the solder-resist layers was set at 3 MPa, and the immersion time to roughen the leveled surfaces was 2.0 minutes. With that exception, a printed wiring board was produced in the same manner as in Example 27. The leveled surface in the electronic component mounting region in this example was formed to have a maximum surface roughness of 3.0 μm; and the roughened surface was formed to have a maximum surface roughness of 0.45 μm and an arithmetic mean deviation (Ra) of the profile or roughness of approximately 0.4 μm.

Example 38

The pressure when leveling the solder-resist layers was set at 3 MPa, and the immersion time to roughen the leveled surfaces was 2.0 minutes. With that exception, a printed wiring board was produced in the same manner as in Example 28. The leveled surface in the electronic component mounting region in this example was formed to have a maximum surface roughness of 3.0 μm; and the roughened surface was formed to have a maximum surface roughness of 0.5 μm and an arithmetic mean deviation (Ra) of the profile or roughness of approximately 0.4 μm.

Example 39

The pressure when leveling the solder-resist layers was set at 3 MPa, and the immersion time to roughen the leveled surfaces was 1.5 minutes. With that exception, a printed wiring board was produced in the same manner as in Example 29. The leveled surface in the electronic component mounting region in this example was formed to have a maximum surface roughness of 3.1 μm, the roughened surface was formed to have a maximum surface roughness of 0.4 μm, and the arithmetic mean deviation (Ra) of the profile or roughness of approximately 0.3 μm.

Example 40

The pressure when leveling the solder-resist layers was set at 3 MPa, and the immersion time to roughen the leveled surfaces was 1.0 minute. With that exception, a printed wiring board was produced in the same manner as in Example 30. The leveled surface in the electronic component mounting region in this example was formed to have a maximum surface roughness of 3.2 μm; and the roughened surface was formed to have a maximum surface roughness of 0.25 μm and an arithmetic mean deviation (Ra) of the profile or roughness of approximately 0.2 μm.

Example 41

The pressure when leveling the solder-resist layers was set at 1 MPa, and the immersion time to roughen the leveled surfaces was 2.5 minutes. With that exception, a printed wiring board was produced in the same manner as in Example 26. The leveled surface in the electronic component mounting region in this example was formed to have a maximum surface roughness of 4.8 μm; and the roughened surface was formed to have a maximum surface roughness of 0.55 μm and an arithmetic mean deviation (Ra) of the profile or roughness of approximately 0.5 μm.

Example 42

The pressure when leveling the solder-resist layers was set at 1 MPa and the immersion time to roughen the leveled surfaces was 1 minute. With that exception, a printed wiring board was produced in the same manner as in Example 27. The leveled surface in the electronic component mounting region in this example was formed to have a maximum surface roughness of 4.7 µm; and the roughened surface was formed to have a maximum surface roughness of 0.25 µm and an arithmetic mean deviation (Ra) of the profile or roughness of approximately 0.2 µm.

Example 43

The pressure when leveling the solder-resist layers was set at 1 MPa, and the immersion time to roughen the leveled surfaces was 1.5 minutes. With that exception, a printed wiring board was produced in the same manner as in Example 28. The leveled surface in the electronic component mounting region in this example was formed to have a maximum surface roughness of 5.0 µm; and the roughened surface was formed to have a maximum surface roughness of 0.4 µm and an arithmetic mean deviation (Ra) of the profile or roughness of approximately 0.35 µm.

Example 44

The pressure when leveling the solder-resist layers was set at 1 MPa, and the immersion time to roughen the leveled surfaces was 1.0 minute. With that exception, a printed wiring board was produced in the same manner as in Example 29. The leveled surface in the electronic component mounting region in this example was formed to have a maximum surface roughness of 4.9 µm; and the roughened surface was formed to have a maximum surface roughness of 0.25 µm and an arithmetic mean deviation (Ra) of the profile or roughness of approximately 0.2 µm.

Example 45

The pressure when leveling the solder-resist layers was set at 1 MPa, and the immersion time to roughen the leveled surfaces was 2.5 minutes. With that exception, a printed wiring board was produced in the same manner as in Example 30. The leveled surface in the electronic component mounting region in this example was formed to have a maximum surface roughness of 5.0 µm; and the roughened surface was formed to have a maximum surface roughness of 0.55 µm and an arithmetic mean deviation (Ra) of the profile or roughness of approximately 0.5 µm.

Example 46

The pressure when leveling the solder-resist layers was set at 1 MPa, the pressing temperature was set at 60° C. and the immersion time to roughen the leveled surfaces was 2.0 minutes. With that exception, a printed wiring board was produced in the same manner as in Example 26. The leveled surface in the electronic component mounting region in this example was formed to have a maximum surface roughness of 7.0 µm; and the roughened surface was formed to have a maximum surface roughness of 0.45 µm and an arithmetic mean deviation (Ra) of the profile or roughness of approximately 0.4 µm.

Example 47

The pressure when leveling the solder-resist layers was set at 1 MPa, the pressing temperature was set at 60° C. and the immersion time to roughen the leveled surfaces was 1.5 minutes. With that exception, a printed wiring board was produced in the same manner as in Example 27. The leveled surface in the electronic component mounting region in this example was formed to have a maximum surface roughness of 7.2 µm; and the roughened surface was formed to have a maximum surface roughness of 0.35 µm and an arithmetic mean deviation (Ra) of the profile or roughness of approximately 0.3 µm.

Example 48

The pressure when leveling the solder-resist layers was set at 1 MPa, the pressing temperature was set at 60° C. and the immersion time to roughen the leveled surfaces was 1.0 minute. With that exception, a printed wiring board was produced in the same manner as in Example 28. The leveled surface in the electronic component mounting region in this example was formed to have a maximum surface roughness of 7.3 µm; and the roughened surface was formed to have a maximum surface roughness of 0.25 µm and an arithmetic mean deviation (Ra) of the profile or roughness of approximately 0.2 µm.

Example 49

The pressure when leveling the solder-resist layers was set at 1 MPa, the pressing temperature was set at 60° C. and the immersion time to roughen the leveled surfaces was 1.5 minutes. With that exception, a printed wiring board was produced in the same manner as in Example 29. The leveled surface in the electronic component mounting region in this example was formed to have a maximum surface roughness of 7.5 µm; and the roughened surface was formed to have a maximum surface roughness of 0.4 µm and an arithmetic mean deviation of the profile (Ra) of approximately 0.3 µm.

Example 50

The pressure when leveling the solder-resist layers was set at 1 MPa, the pressing temperature was set at 60° C. and the immersion time to roughen the leveled surfaces was 1.0 minute. With that exception, a printed wiring board was produced in the same manner as in Example 30. The leveled surface in the electronic component mounting region in this example was formed to have a maximum surface roughness of 7.5 µm; and the roughened surface was formed to have a maximum surface roughness of 0.25 µm and an arithmetic mean deviation (Ra) of the profile or roughness of approximately 0.2 µm.

Example 51

The immersion time when roughening the leveled surfaces of the solder-resist layers was set at 2.75 minutes. With that exception, a printed wiring board was produced in the same manner as in Example 31. The leveled surface in the electronic component mounting region in this example was formed to have a maximum surface roughness of 0.7 µm; and the roughened surface was formed to have a maximum surface roughness of 0.6 µm and an arithmetic mean deviation (Ra) of the profile or roughness of approximately 0.55 µm.

Example 52

The immersion time when roughening the leveled surfaces of the solder-resist layers was set at 3.0 minutes. With that exception, a printed wiring board was produced in the same manner as in Example 32. The leveled surface in the electronic component mounting region in this example was formed to have a maximum surface roughness of 0.8 μm; and the roughened surface was formed to have a maximum surface roughness of 0.65 μm and an arithmetic mean deviation (Ra) of the profile or roughness of approximately 0.55 μm.

Example 53

The immersion time when roughening the leveled surfaces of the solder-resist layers was set at 2.75 minutes. With that exception, a printed wiring board was produced in the same manner as in Example 33. The leveled surface in the electronic component mounting region in this example was formed to have a maximum surface roughness of 0.8 μm; and the roughened surface was formed to have a maximum surface roughness of 0.6 μm and an arithmetic mean deviation (Ra) of the profile or roughness of approximately 0.55 μm.

Example 54

The immersion time when roughening the leveled surfaces of the solder-resist layers was set at 2.75 minutes. With that exception, a printed wiring board was produced in the same manner as in Example 34. The leveled surface in the electronic component mounting region in this example was formed to have a maximum surface roughness of 0.7 μm; and the roughened surface was formed to have a maximum surface roughness of 0.6 μm and an arithmetic mean deviation (Ra) of the profile or roughness of approximately 0.55 μm.

Example 55

The immersion time when roughening the leveled surfaces of the solder-resist layers was set at 3.25 minutes. With that exception, a printed wiring board was produced in the same manner as in Example 35. The leveled surface in the electronic component mounting region in this example was formed to have a maximum surface roughness of 0.8 μm; and the roughened surface was formed to have a maximum surface roughness of 0.65 μm and an arithmetic mean deviation (Ra) of the profile or roughness of approximately 0.6 μm.

Example 56

The immersion time when roughening the leveled surfaces of the solder-resist layers was set at 4.0 minutes. With that exception, a printed wiring board was produced in the same manner as in Example 36. The leveled surface in the electronic component mounting region in this example was formed to have a maximum surface roughness of 3.0 μm; and the roughened surface was formed to have a maximum surface roughness of 0.8 μm and an arithmetic mean deviation (Ra) of the profile or roughness of approximately 0.7 μm.

Example 57

The immersion time when roughening the leveled surfaces of the solder-resist layers was set at 3.5 minutes. With that exception, a printed wiring board was produced in the same manner as in Example 37. The leveled surface in the electronic component mounting region in this example was formed to have a maximum surface roughness of 3.0 μm; and the roughened surface was formed to have a maximum surface roughness of 0.8 μm and an arithmetic mean deviation (Ra) of the profile or roughness of approximately 0.65 μm.

Example 58

The immersion time when roughening the leveled surfaces of the solder-resist layers was set at 3.25 minutes. With that exception, a printed wiring board was produced in the same manner as in Example 38. The leveled surface in the electronic component mounting region in this example was formed to have a maximum surface roughness of 3.0 μm; and the roughened surface was formed to have a maximum surface roughness of 0.7 μm and an arithmetic mean deviation (Ra) of the profile or roughness of approximately 0.6 μm.

Example 59

The immersion time when roughening the leveled surfaces of the solder-resist layers was set at 3.5 minutes. With that exception, a printed wiring board was produced in the same manner as in Example 39. The leveled surface in the electronic component mounting region in this example was formed to have a maximum surface roughness of 3.1 μm; and the roughened surface was formed to have a maximum surface roughness of 0.8 μm and an arithmetic mean deviation (Ra) of the profile or roughness of approximately 0.65 μm.

Example 60

The immersion time when roughening the leveled surfaces of the solder-resist layers was set at 4.0 minutes. With that exception, a printed wiring board was produced in the same manner as in Example 40. The leveled surface in the electronic component mounting region in this example was formed to have a maximum surface roughness of 3.2 μm; and the roughened surface was formed to have a maximum surface roughness of 0.8 μm and an arithmetic mean deviation (Ra) of the profile or roughness of approximately 0.7 μm.

Example 61

The immersion time when roughening the leveled surfaces of the solder-resist layers was set at 3.0 minutes. With that exception, a printed wiring board was produced in the same manner as in Example 41. The leveled surface in the electronic component mounting region in this example was formed to have a maximum surface roughness of 4.8 μm; and the roughened surface was formed to have a maximum surface roughness of 0.65 μm and an arithmetic mean deviation (Ra) of the profile or roughness of approximately 0.55 μm.

Example 62

The immersion time when roughening the leveled surfaces of the solder-resist layers was set at 2.75 minutes. With that exception, a printed wiring board was produced in the same manner as in Example 42. The leveled surface in the electronic component mounting region in this example was formed to have a maximum surface roughness of 4.7 μm; and the roughened surface was formed to have a maximum surface roughness of 0.6 μm and an arithmetic mean deviation (Ra) of the profile or roughness of approximately 0.55 μm.

Example 63

The immersion time when roughening the leveled surfaces of the solder-resist layers was set at 3.25 minutes. With that exception, a printed wiring board was produced in the same manner as in Example 43. The leveled surface in the electronic component mounting region in this example was formed to have a maximum surface roughness of 5.0 µm; and the roughened surface was formed to have a maximum surface roughness of 0.7 µm and an arithmetic mean deviation (Ra) of the profile or roughness of approximately 0.6 µm.

Example 64

The immersion time when roughening the leveled surfaces of the solder-resist layers was set at 3.0 minutes. With that exception, a printed wiring board was produced in the same manner as in Example 44. The leveled surface in the electronic component mounting region in this example was formed to have a maximum surface roughness of 4.9 µm; and the roughened surface was formed to have a maximum surface roughness of 0.65 µm and an arithmetic mean deviation (Ra) of the profile or roughness of approximately 0.55 µm.

Example 65

The immersion time when roughening the leveled surfaces of the solder-resist layers was set at 4.0 minutes. With that exception, a printed wiring board was produced in the same manner as in Example 45. The leveled surface in the electronic component mounting region in this example was formed to have a maximum surface roughness of 5.0 µm; and the roughened surface was formed to have a maximum surface roughness of 0.8 µm and an arithmetic mean deviation (Ra) of the profile or roughness of approximately 0.7 µm.

Example 66

The immersion time when roughening the leveled surfaces of the solder-resist layers was set at 3.75 minutes. With that exception, a printed wiring board was produced in the same manner as in Example 46. The leveled surface in the electronic component mounting region in this example was formed to have a maximum surface roughness of 7.0 µm; and the roughened surface was formed to have a maximum surface roughness of 0.75 µm and an arithmetic mean deviation (Ra) of the profile or roughness of approximately 0.65 µm.

Example 67

The immersion time when roughening the leveled surfaces of the solder-resist layers was set at 3.0 minutes. With that exception, a printed wiring board was produced in the same manner as in Example 47. The leveled surface in the electronic component mounting region in this example was formed to have a maximum surface roughness of 7.2 µm; and the roughened surface was formed to have a maximum surface roughness of 0.7 µm and an arithmetic mean deviation (Ra) of the profile or roughness of approximately 0.55 µm.

Example 68

The immersion time when roughening the leveled surfaces of the solder-resist layers was set at 2.75 minutes. With that exception, a printed wiring board was produced in the same manner as in Example 48. The leveled surface in the electronic component mounting region in this example was formed to have a maximum surface roughness of 7.3 µm; and the roughened surface was formed to have a maximum surface roughness of 0.6 µm and an arithmetic mean deviation (Ra) of the profile or roughness of approximately 0.55 µm.

Example 69

The immersion time when roughening the leveled surfaces of the solder-resist layers was set at 3.5 minutes. With that exception, a printed wiring board was produced in the same manner as in Example 49. The leveled surface in the electronic component mounting region in this example was formed to have a maximum surface roughness of 7.5 µm; and the roughened surface was formed to have a maximum surface roughness of 0.75 µm and an arithmetic mean deviation (Ra) of the profile or roughness of approximately 0.65 µm.

Example 70

The immersion time when roughening the leveled surfaces of the solder-resist layers was set at 3.5 minutes. With that exception, a printed wiring board was produced in the same manner as in Example 30. The leveled surface in the electronic component mounting region in this example was formed to have a maximum surface roughness of 7.5 µm; and the roughened surface was formed to have a maximum surface roughness of 0.7 µm and an arithmetic mean deviation (Ra) of the profile or roughness of approximately 0.65 µm.

Example 71

The immersion time when roughening the leveled surfaces of the solder-resist layers was set at 12 minutes. With that exception, a printed wiring board was produced in the same manner as in Example 26. The leveled surface in the electronic component mounting region in this example was formed to have a maximum surface roughness of 0.3 µm; and the roughened surface was formed to have a maximum surface roughness of 3.0 µm and an arithmetic mean deviation (Ra) of the profile or roughness of approximately 2.3 µm.

Comparative Example 1

Except that the leveling treatment and roughening treatment were not conducted on the solder-resist layers, a printed wiring board was produced in the same manner as in Example 1. The surface of the electronic component mounting region in this comparative example was formed to have a maximum surface roughness of 9.8 µm.

Comparative Example 2

Except that the leveling treatment and roughening treatment were not conducted on the solder-resist layers, a printed wiring board was produced in the same manner as in Example 2. The surface of the electronic component mounting region in this comparative example was formed to have a maximum surface roughness of 9.6 µm.

Comparative Example 3

Except that the leveling treatment and roughening treatment were not conducted on the solder-resist layers, a printed wiring board was produced in the same manner as in Example 3. The surface of the electronic component mounting region in this comparative example was formed to have a maximum surface roughness of 10.0 µm.

Comparative Example 4

Except that the leveling treatment and roughening treatment were not conducted on the solder-resist layers, a printed wiring board was produced in the same manner as in Example 4. The surface of the electronic component mounting region in this comparative example was formed to have a maximum surface roughness of 9.8 µm.

Comparative Example 5

Except that the leveling treatment and roughening treatment were not conducted on the solder-resist layers, a printed wiring board was produced in the same manner as in Example 5. The surface of the electronic component mounting region in this comparative example was formed to have a maximum surface roughness of 10.0 μm. On printed wiring boards produced according to Examples 1-71 and Comparative Examples 1-5, tests to measure the number of voids in the underfill, and to evaluate the degree of tolerance to heat cycles (connection reliability) and the electrical conductivity were each conducted as follows: The results of each measurement test are shown in Tables 1-4.

Evaluation Test 1

On printed wiring boards produced according to Examples 1-71 and Comparative Examples 1-5, the interior portion of the underfill filled between the solder-resist layer and the mounted IC chip was observed using an X-ray television system (SMX-100, made by Shimadzu Corp.) and the number of existing voids was measured.

Evaluation Test 2

Printed wiring boards produced according to Examples 1-71 and Comparative Examples 1-5, while voltage was applied between independent bumps, were put under HAST tests (high temperature-high humidity-bias tests: 85° C./85% 13.3 V). Then, after 50 hours, 100 hours and 200 hours, insulation resistance values between the independent bumps (150 μm pitches) were each measured. If the insulation resistance values after HAST testing are $10^7 \Omega$ or larger, the results are indicated as "○," if less than $10^7 \Omega$, the results are indicated as "x." The target value for an insulation resistance value measured after 50 hours is $10^7 \Omega$ or larger.

Evaluation Test 3

One hundred printed wiring boards produced according to Examples 1-71 and Comparative Examples 1-5 were each prepared and their conductivity was tested. Next, 10 good samples were each picked at random, and heat cycle tests at $-55°$ C.×5 minutes ⇔$125°$ C.×5 minutes were conducted 500 times, 1,000 times and 2,000 times. Varied amounts of connection resistance on a specified circuit running from the bottom surface (the surface opposite the IC mounting surface) of a printed wiring board through the IC chip and again to the bottom surface of the printed wiring board were measured to examine electrical conductivity. Varied amounts of connection resistance are given as ((connection resistance value after heat cycle testing−initial connection resistance value)/initial connection resistance value)×100. If the value of one among 10 good samples exceeds 10%, electrical conductivity is considered inferior and is indicated as "x" and if the value of all 10 samples is each 10% or smaller, electrical conductivity is considered good and is indicated as "○."

TABLE 1

| | | Pad Forming Conditions | | | | | | Evaluation Test Results | | | | | |
|---|---|---|---|---|---|---|---|---|---|---|---|---|---|
| | | Leveling Treatment Conditions | | | | Area of Electronic Component Mounting Region | Rmax* (μm) on Solder-Resist | No. of Voids in Underfill | HAST | | | Heat-Cycle Test | | |
| | | Press. (MPa) | Time (min) | Temp. (C. °) | No. of Pads | (mm²) | Layer Surface | (No./cm²) | 50 | 100 | 200 | 500 | 1000 | 2000 |
| EXAMPLES | 1 | 5 | 2 | 80 | 1000 | 40 | 0.3 | 0 | ○ | ○ | x | ○ | ○ | x |
| | 2 | 5 | 2 | 80 | 2000 | 70 | 0.5 | 0 | ○ | ○ | x | ○ | ○ | x |
| | 3 | 5 | 2 | 80 | 4000 | 130 | 0.4 | 0 | ○ | x | x | ○ | x | x |
| | 4 | 5 | 2 | 80 | 10000 | 310 | 0.5 | 0 | ○ | x | x | ○ | x | x |
| | 5 | 5 | 2 | 80 | 30000 | 900 | 0.5 | 0 | ○ | x | x | ○ | x | x |
| | 6 | 5 | 2 | 60 | 1000 | 40 | 0.7 | 0 | ○ | ○ | ○ | ○ | ○ | ○ |
| | 7 | 5 | 2 | 60 | 2000 | 70 | 0.8 | 0 | ○ | ○ | ○ | ○ | ○ | ○ |
| | 8 | 5 | 2 | 60 | 4000 | 130 | 0.8 | 0 | ○ | ○ | ○ | ○ | ○ | ○ |
| | 9 | 5 | 2 | 60 | 10000 | 310 | 0.7 | 0 | ○ | ○ | ○ | ○ | ○ | ○ |
| | 10 | 5 | 2 | 60 | 30000 | 900 | 0.8 | 0 | ○ | ○ | ○ | ○ | ○ | ○ |
| | 11 | 3 | 2 | 80 | 1000 | 40 | 2.0 | 0 | ○ | ○ | ○ | ○ | ○ | ○ |
| | 12 | 3 | 2 | 80 | 2000 | 70 | 2.0 | 0 | ○ | ○ | ○ | ○ | ○ | ○ |
| | 13 | 3 | 2 | 80 | 4000 | 130 | 2.0 | 0 | ○ | ○ | ○ | ○ | ○ | ○ |
| | 14 | 3 | 2 | 80 | 10000 | 310 | 2.1 | 0 | ○ | ○ | ○ | ○ | ○ | ○ |
| | 15 | 3 | 2 | 80 | 30000 | 900 | 2.2 | 0 | ○ | ○ | ○ | ○ | ○ | ○ |
| | 16 | 1 | 2 | 80 | 1000 | 40 | 4.8 | 1 | ○ | ○ | ○ | ○ | ○ | ○ |
| | 17 | 1 | 2 | 80 | 2000 | 70 | 4.7 | 1 | ○ | ○ | ○ | ○ | ○ | ○ |
| | 18 | 1 | 2 | 80 | 4000 | 130 | 5.0 | 1 | ○ | ○ | x | ○ | ○ | x |
| | 19 | 1 | 2 | 80 | 10000 | 310 | 4.9 | 1 | ○ | ○ | x | ○ | ○ | x |
| | 20 | 1 | 2 | 80 | 30000 | 900 | 5.0 | 1 | ○ | ○ | x | ○ | ○ | x |
| | 21 | 1 | 2 | 60 | 1000 | 40 | 7.0 | 3 | ○ | ○ | x | ○ | ○ | x |
| | 22 | 1 | 2 | 60 | 2000 | 70 | 7.2 | 4 | ○ | ○ | x | ○ | ○ | x |
| | 23 | 1 | 2 | 60 | 4000 | 130 | 7.3 | 4 | ○ | x | x | ○ | x | x |
| | 24 | 1 | 2 | 60 | 10000 | 310 | 7.5 | 5 | ○ | x | x | ○ | x | x |
| | 25 | 1 | 2 | 60 | 30000 | 900 | 7.5 | 5 | ○ | x | x | ○ | x | x |

*Rmax: Maximum Surface Roughness

TABLE 2

| | | Pressing Conditions | | | Roughening Conditions Immersion | No. of | Pad | Solder-Resist Layer Surface Roughness (μm) | | No. of Voids in Underfill |
|---|---|---|---|---|---|---|---|---|---|---|
| | | Press (Mpa) | Time (min.) | Temp (°C.) | Time (min) | Pads (No.) | Area (mm$^2$) | Rmax*: Leveled Surface (1st Roughened Surface) | Rmax*/Ra (2nd Roughened Surface) | (No./ 10 mm$^2$) |
| EXAMPLES | 26 | 5 | 2 | 80 | 1.0 | 1000 | 40 | 0.3 | 0.25/0.2 | 0 |
| | 27 | 5 | 2 | 80 | 1.0 | 2000 | 70 | 0.5 | 0.25/0.2 | 0 |
| | 28 | 5 | 2 | 80 | 1.0 | 4000 | 130 | 0.4 | 0.25/0.2 | 0 |
| | 29 | 5 | 2 | 80 | 1.0 | 10000 | 310 | 0.5 | 0.25/0.2 | 0 |
| | 30 | 5 | 2 | 80 | 1.0 | 30000 | 1200 | 0.5 | 0.25/0.2 | 0 |
| | 31 | 5 | 2 | 60 | 1.5 | 1000 | 40 | 0.7 | 0.4/0.3 | 0 |
| | 32 | 5 | 2 | 60 | 1.5 | 2000 | 70 | 0.8 | 0.4/0.3 | 0 |
| | 33 | 5 | 2 | 60 | 1.5 | 4000 | 130 | 0.8 | 0.4/0.3 | 0 |
| | 34 | 5 | 2 | 60 | 2.0 | 10000 | 310 | 0.7 | 0.45/0.4 | 0 |
| | 35 | 5 | 2 | 60 | 2.5 | 30000 | 1200 | 0.8 | 0.55/0.5 | 0 |
| | 36 | 3 | 2 | 80 | 2.0 | 1000 | 40 | 3.0 | 0.45/0.35 | 0 |
| | 37 | 3 | 2 | 80 | 2.0 | 2000 | 70 | 3.0 | 0.45/0.4 | 0 |
| | 38 | 3 | 2 | 80 | 2.0 | 4000 | 130 | 3.0 | 0.5/0.4 | 0 |
| | 39 | 3 | 2 | 80 | 1.5 | 10000 | 310 | 3.1 | 0.4/0.3 | 0 |
| | 40 | 3 | 2 | 80 | 1.0 | 30000 | 1200 | 3.2 | 0.25/0.2 | 0 |
| | 41 | 1 | 2 | 80 | 2.5 | 1000 | 40 | 4.8 | 0.55/0.5 | 1 |
| | 42 | 1 | 2 | 80 | 1.0 | 2000 | 70 | 4.7 | 0.25/0.2 | 1 |
| | 43 | 1 | 2 | 80 | 1.5 | 4000 | 130 | 5.0 | 0.4/0.35 | 1 |
| | 44 | 1 | 2 | 80 | 1.0 | 10000 | 310 | 4.9 | 0.25/0.2 | 1 |
| | 45 | 1 | 2 | 80 | 2.5 | 30000 | 1200 | 5.0 | 0.55/0.5 | 1 |
| | 46 | 1 | 2 | 60 | 2.0 | 1000 | 40 | 7.0 | 0.45/0.4 | 3 |
| | 47 | 1 | 2 | 60 | 1.5 | 2000 | 70 | 7.2 | 0.35/0.3 | 4 |
| | 48 | 1 | 2 | 60 | 1.0 | 4000 | 130 | 7.3 | 0.25/0.2 | 4 |
| | 49 | 1 | 2 | 60 | 1.5 | 10000 | 310 | 7.5 | 0.4/0.3 | 5 |
| | 50 | 1 | 2 | 60 | 1.0 | 30000 | 1200 | 7.5 | 0.25/0.2 | 5 |

| | | Evaluation Test Results | | | | | | | | | |
|---|---|---|---|---|---|---|---|---|---|---|---|
| | | HAST | | | | | Thermal Impact Test | | | | |
| | | 50 | 100 | 200 | 250 | 300 | 500 | 1000 | 2000 | 2500 | 3000 |
| EXAMPLES | 26 | ○ | ○ | ○ | x | x | ○ | ○ | ○ | x | x |
| | 27 | ○ | ○ | ○ | x | x | ○ | ○ | ○ | x | x |
| | 28 | ○ | ○ | ○ | x | x | ○ | ○ | ○ | x | x |
| | 29 | ○ | ○ | ○ | x | x | ○ | ○ | ○ | x | x |
| | 30 | ○ | ○ | ○ | x | x | ○ | ○ | ○ | x | x |
| | 31 | ○ | ○ | ○ | ○ | ○ | ○ | ○ | ○ | ○ | ○ |
| | 32 | ○ | ○ | ○ | ○ | ○ | ○ | ○ | ○ | ○ | ○ |
| | 33 | ○ | ○ | ○ | ○ | ○ | ○ | ○ | ○ | ○ | ○ |
| | 34 | ○ | ○ | ○ | ○ | ○ | ○ | ○ | ○ | ○ | ○ |
| | 35 | ○ | ○ | ○ | ○ | ○ | ○ | ○ | ○ | ○ | ○ |
| | 36 | ○ | ○ | ○ | ○ | ○ | ○ | ○ | ○ | ○ | ○ |
| | 37 | ○ | ○ | ○ | ○ | ○ | ○ | ○ | ○ | ○ | ○ |
| | 38 | ○ | ○ | ○ | ○ | ○ | ○ | ○ | ○ | ○ | ○ |
| | 39 | ○ | ○ | ○ | ○ | ○ | ○ | ○ | ○ | ○ | ○ |
| | 40 | ○ | ○ | ○ | ○ | ○ | ○ | ○ | ○ | ○ | ○ |
| | 41 | ○ | ○ | ○ | ○ | x | ○ | ○ | ○ | ○ | x |
| | 42 | ○ | ○ | ○ | ○ | x | ○ | ○ | ○ | ○ | x |
| | 43 | ○ | ○ | ○ | ○ | x | ○ | ○ | ○ | ○ | x |
| | 44 | ○ | ○ | ○ | ○ | x | ○ | ○ | ○ | ○ | x |
| | 45 | ○ | ○ | ○ | ○ | x | ○ | ○ | ○ | ○ | x |
| | 46 | ○ | ○ | ○ | x | x | ○ | ○ | ○ | x | x |
| | 47 | ○ | ○ | ○ | x | x | ○ | ○ | ○ | x | x |
| | 48 | ○ | ○ | ○ | x | x | ○ | ○ | ○ | x | x |
| | 49 | ○ | ○ | ○ | x | x | ○ | ○ | ○ | x | x |
| | 50 | ○ | ○ | ○ | x | x | ○ | ○ | ○ | x | x |

*Rmax: Maximum Surface Roughness

TABLE 3

| | | Pressing Conditions | | | Roughening Conditions Immersion | No. of | Pad | Solder-Resist Layer Surface Roughness (μm) | | No. of Voids in Underfill |
|---|---|---|---|---|---|---|---|---|---|---|
| | | Press (Mpa) | Time (min.) | Temp (° C.) | Time (min.) | Pads (No.) | Area (mm²) | Rmax*: Leveled Surface (1st Roughened Surface) | Rmax*/Ra (2nd Roughened Surface) | (No./ 10 mm²) |
| EXAMPLES | 51 | 5 | 2 | 60 | 2.75 | 1000 | 40 | 0.7 | 0.6/0.55 | 0 |
| | 52 | 5 | 2 | 60 | 3.0 | 2000 | 70 | 0.8 | 0.65/0.55 | 0 |
| | 53 | 5 | 2 | 60 | 2.75 | 4000 | 130 | 0.8 | 0.6/0.55 | 0 |
| | 54 | 5 | 2 | 60 | 2.75 | 10000 | 310 | 0.7 | 0.6/0.55 | 0 |
| | 55 | 5 | 2 | 60 | 3.25 | 30000 | 1200 | 0.8 | 0.65/0.6 | 0 |
| | 56 | 3 | 2 | 80 | 4.0 | 1000 | 40 | 3.0 | 0.8/0.7 | 0 |
| | 57 | 3 | 2 | 80 | 3.5 | 2000 | 70 | 3.0 | 0.8/0.65 | 0 |
| | 58 | 3 | 2 | 80 | 3.25 | 4000 | 130 | 3.0 | 0.7/0.6 | 0 |
| | 59 | 3 | 2 | 80 | 3.5 | 10000 | 310 | 3.1 | 0.8/0.65 | 0 |
| | 60 | 3 | 2 | 80 | 4.0 | 30000 | 1200 | 3.2 | 0.8/0.7 | 0 |
| | 61 | 1 | 2 | 80 | 3.0 | 1000 | 40 | 4.8 | 0.65/0.55 | 1 |
| | 62 | 1 | 2 | 80 | 2.75 | 2000 | 70 | 4.7 | 0.6/0.55 | 1 |
| | 63 | 1 | 2 | 80 | 3.25 | 4000 | 130 | 5.0 | 0.7/0.6 | 1 |
| | 64 | 1 | 2 | 80 | 3.0 | 10000 | 310 | 4.9 | 0.65/0.55 | 1 |
| | 65 | 1 | 2 | 80 | 4.0 | 30000 | 1200 | 5.0 | 0.8/0.7 | 1 |
| | 66 | 1 | 2 | 60 | 3.75 | 1000 | 40 | 7.0 | 0.75/0.65 | 3 |
| | 67 | 1 | 2 | 60 | 3.0 | 2000 | 70 | 7.2 | 0.7/0.55 | 4 |
| | 68 | 1 | 2 | 60 | 2.75 | 4000 | 130 | 7.3 | 0.6/0.55 | 4 |
| | 69 | 1 | 2 | 60 | 3.5 | 10000 | 310 | 7.5 | 0.75/0.65 | 5 |
| | 70 | 1 | 2 | 60 | 3.5 | 30000 | 1200 | 7.5 | 0.7/0.65 | 5 |
| | 71 | 5 | 2 | 80 | 12 | 1000 | 40 | 0.3 | 3.0/2.3 | 0 |

| | | Evaluation Test Results | | | | | | | | | |
|---|---|---|---|---|---|---|---|---|---|---|---|
| | | HAST | | | | | Thermal Impact Test | | | | |
| | | 50 | 100 | 200 | 250 | 300 | 500 | 1000 | 2000 | 2500 | 3000 |
| EXAMPLES | 51 | ○ | ○ | ○ | ○ | ○ | ○ | ○ | ○ | ○ | ○ |
| | 52 | ○ | ○ | ○ | ○ | x | ○ | ○ | ○ | ○ | x |
| | 53 | ○ | ○ | ○ | ○ | x | ○ | ○ | ○ | ○ | x |
| | 54 | ○ | ○ | ○ | ○ | x | ○ | ○ | ○ | ○ | x |
| | 55 | ○ | ○ | ○ | ○ | x | ○ | ○ | ○ | ○ | x |
| | 56 | ○ | ○ | ○ | ○ | x | ○ | ○ | ○ | ○ | x |
| | 57 | ○ | ○ | ○ | ○ | x | ○ | ○ | ○ | ○ | x |
| | 58 | ○ | ○ | ○ | ○ | x | ○ | ○ | ○ | ○ | x |
| | 59 | ○ | ○ | ○ | ○ | x | ○ | ○ | ○ | ○ | x |
| | 60 | ○ | ○ | ○ | ○ | x | ○ | ○ | ○ | ○ | x |
| | 61 | ○ | ○ | ○ | ○ | x | ○ | ○ | ○ | ○ | x |
| | 62 | ○ | ○ | ○ | x | x | ○ | ○ | ○ | x | x |
| | 63 | ○ | ○ | ○ | x | x | ○ | ○ | ○ | x | x |
| | 64 | ○ | ○ | ○ | x | x | ○ | ○ | ○ | x | x |
| | 65 | ○ | ○ | ○ | x | x | ○ | ○ | ○ | x | x |
| | 66 | ○ | ○ | ○ | x | x | ○ | ○ | ○ | x | x |
| | 67 | ○ | ○ | ○ | x | x | ○ | ○ | x | x | x |
| | 68 | ○ | ○ | x | x | x | ○ | ○ | x | x | x |
| | 69 | ○ | ○ | x | x | x | ○ | ○ | x | x | x |
| | 70 | ○ | ○ | x | x | x | ○ | ○ | x | x | x |
| | 71 | ○ | x | x | x | x | ○ | x | x | x | x |

*Rmax: Maximum Surface Roughness

TABLE 4

| | | Pressing Conditions | | | Roughening Conditions Immersion | No. of | Pad | Solder-Resist Layer Surface Roughness(μm) | | No. of Voids in Underfill |
|---|---|---|---|---|---|---|---|---|---|---|
| | | Press. (Mpa) | Time (min.) | Temp (° C.) | Time (min.) | Pads (No.) | Area (mm²) | Rmax*: Leveled Surface (1st Roughened Surface) | Rmax*/Ra (2nd Roughened Surface) | (No./ 10 mm²) |
| *COMP. | 1 | 0 | 0 | 0 | 0 | 1000 | 40 | 9.8 | — | 10 |
| | 2 | 0 | 0 | 0 | 0 | 2000 | 70 | 9.6 | — | 11 |

TABLE 4-continued

| | | | | | | | | | |
|---|---|---|---|---|---|---|---|---|---|
| 3 | 0 | 0 | 0 | 0 | 4000 | 130 | 10.0 | — | 12 |
| 4 | 0 | 0 | 0 | 0 | 10000 | 310 | 9.8 | — | 11 |
| 5 | 0 | 0 | 0 | 0 | 30000 | 1200 | 10.0 | — | 13 |

| | | | Evaluation Test Results | | | | | | | | | |
|---|---|---|---|---|---|---|---|---|---|---|---|---|
| | | | HAST | | | | | Thermal Impact Test | | | | |
| | | | 50 | 100 | 200 | 250 | 300 | 500 | 1000 | 2000 | 2500 | 3000 |
| *COMP. | 1 | x | x | x | x | x | x | x | x | x | x |
| | 2 | x | x | x | x | x | x | x | x | x | x |
| | 3 | x | x | x | x | x | x | x | x | x | x |
| | 4 | x | x | x | x | x | x | x | x | x | x |
| | 5 | x | x | x | x | x | x | x | x | x | x |

*COMP: Comparative Examples
*Rmax: Maximum Surface Roughness

From the results of the above Evaluation Test 1, it has been verified that the smaller the maximum surface roughness of the leveled solder-resist layer surface, the smaller the number of voids in the underfill.

Also, from the above Evaluation Test 2, it has been verified that if the maximum surface roughness of the leveled surface of the solder-resist layer is in a specific range, and also if the arithmetic mean deviation (Ra) of the profile or roughness of a roughened surface is in a specific range, the insulation resistance value between independent bumps after HAST testing is excellent. Especially, it has been found that if the maximum surface roughness of the leveled surface of a solder-resist layer is in the range of 0.3-7.5 µm, and also if the arithmetic mean deviation (Ra) of the profile or roughness of a roughened surface is in the range of 0.2-0.7 µm, the target value can be achieved. Furthermore, if the maximum surface roughness of a leveled surface is in the range of 0.8-3.0 µm, and also if the arithmetic mean deviation (Ra) of the profile or roughness of a roughened surface is in the range of 0.2-0.5 µm, reliability will be higher.

Also, from the above Evaluation Test 3, it has been verified that if the maximum surface roughness of the leveled surface of a solder-resist layer is in a specific range, and also if the arithmetic mean deviation (Ra) of the profile or roughness of a roughened surface is in a specific range, electrical conductivity is excellent. Especially, it has been found that if the maximum surface roughness of the leveled surface of a solder-resist layer is in the range of 0.3-7.5 µm, and also if the arithmetic mean deviation (Ra) of a roughened surface is in the range of 0.2-0.7 µm, the target value can be achieved. Furthermore, if the maximum surface roughness of a leveled surface is in the range of 0.8-3.0 µm, and also if the arithmetic mean deviation (Ra) of the profile or roughness of a roughened surface is in the range of 0.2-0.5 µm, reliability will be higher.

Moreover, according to the results of Evaluation Tests 2 and 3, the area of an electrical component mounting region is correlated to the maximum surface roughness of the leveled surface of a solder-resist layer, or to the arithmetic mean deviation (Ra) of the profile or roughness of a roughened surface. Therefore, it is found that the larger the area, the greater the control required on the maximum surface roughness and the arithmetic mean deviation (Ra) of roughness. It is believed that the larger the area, the greater the influence on adhesive strength between the underfill and the surface of the solder-resist layer and voids in the underfill.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A printed wiring board comprising:
   a core substrate;
   a conductive circuit formed on the core substrate;
   a built-up layer formed over the core substrate and the conductive circuit, the built-up layer comprising a plurality of insulating layers and a plurality of conductive circuits formed on the insulating layers, respectively; and
   a solder-resist layer formed over the built-up layer and having a plurality of openings exposing a plurality of portions of an outermost conductive circuit in the built-up layer, respectively, the plurality of portions of the outermost conductive circuit forming a plurality of conductive pads configured to mount an electronic component,
   wherein the solder-resist layer has a surface including an electronic component mounting region, and the electronic component mounting region has the conductive pads and a leveled surface which has a maximum roughness in a range of 0.3 to 7.5 µm.

2. A printed wiring board according to claim 1, further comprising:
   a plurality of solder bumps formed on the plurality of conductive pads, respectively; and
   an underfill sealing a space between the electronic component and the solder-resist layer.

3. A printed wiring board according to claim 1, wherein the electronic component mounting region has a maximum roughness in a range of 0.8 to 2.0 µm.

4. A printed wiring board according to claim 3, further comprising:
   a plurality of solder bumps formed on the plurality of conductive pads, respectively; and
   an underfill sealing a space between the electronic component and the solder-resist layer.

5. A printed wiring board according to claim 1, further comprising an underfill sealing a space between the electronic component and the solder-resist layer.

6. A printed wiring board comprising:
   a core substrate;
   a conductive circuit formed on the core substrate;
   a built-up layer formed over the core substrate and the conductive circuit, the built-up layer comprising a plurality of insulating layers and a plurality of conductive circuits formed on the insulating layers, respectively; and a solder-resist layer formed over the built-up layer and having a plurality of openings exposing a plurality of portions of an outermost conductive circuit in the built-up layer, respectively, the plurality of portions of the outermost conductive circuit forming a plurality of conductive pads configured to mount an electronic component, wherein the solder-resist layer has a surface including an electronic component mounting region, and the electronic component mounting region has the conductive pads and a leveled surface which has an arithmetic mean deviation (Ra) of roughness in a range of 0.2 to 0.7 μm.

7. A printed wiring board according to claim 6, further comprising:
a plurality of solder bumps formed on the plurality of conductive pads, respectively; and
an underfill sealing a space between the electronic component and the solder-resist layer.

8. A printed wiring board according to claim 6, wherein the electronic component mounting region has an arithmetic mean deviation (Ra) of roughness in a range of 0.2 to 0.5 μm.

9. A printed wiring board according to claim 8, further comprising:
a plurality of solder bumps formed on the plurality of conductive pads, respectively; and
an underfill sealing a space between the electronic component and the solder-resist layer.

10. A printed wiring board according to claim 6, further comprising an underfill sealing a space between the electronic component and the solder-resist layer.

11. A method of manufacturing a printed wiring board, comprising:
preparing a core substrate having a conductive circuit formed on the core substrate;
forming a built-up layer over the core substrate and the conductive circuit, the built-up layer comprising a plurality of insulating layers and a plurality of conductive circuits formed on the insulating layers, respectively;
coating a solder-resist layer over the built-up layer; leveling a surface of the solder-resist layer at least over the conductive circuits in the built-up layer so as to obtain a leveled surface having a maximum surface roughness in a predetermined range;
forming a plurality of openings in the leveled surface of the solder-resist layer to expose a plurality of portions of an outermost conductive circuit in the built-up layer under the leveled surface so as to form an electronic component mounting region and a plurality of conductive pads for mounting an electronic component in the electronic component mounting region; and wherein the maximum roughness is in a range of 0.3 to 7.5 μm.

12. A method of manufacturing a printed wiring board according to claim 11, further comprising:
filling a solder paste on the plurality of conductive pads so as to form a plurality of solder bumps;
mounting the electronic component to the plurality of conductive pads through the plurality of solder bumps; and
filling an underfill material between the electronic component and the surface of the solder-resist layer so as to seal the electronic component.

13. A method of manufacturing a printed wiring board according to claim 11, further comprising mounting the electronic component through the plurality of conductive pads.

14. A method of manufacturing a printed wiring board according to claim 13, further comprising filling an underfill material between the mounted electronic component and the surface of the solder-resist layer so as to seal the electronic component.

15. A method of manufacturing a printed wiring board according to claim 11, further comprising applying a roughening treatment on the surface of the solder-resist layer so as to form a roughened surface having an arithmetic mean deviation (Ra) of roughness smaller than the maximum surface roughness.

16. A method of manufacturing a printed wiring board according to claim 11, wherein the leveling comprises laminating a resin film on the surface of the solder-resist layer, applying a thermal pressing treatment from above the resin film and removing the resin film from the surface of the solder-resist layer.

17. A method of manufacturing a printed wiring board according to claim 11, further comprising:
mounting the electronic component to the plurality of conductive pads; and
filling an underfill material between the electronic component and the surface of the solder-resist layer so as to seal the electronic component.

18. A method of manufacturing a printed wiring board according to claim 16, wherein the thermal pressing treatment is conducted under conditions including a pressing temperature ranging between 35 to 100° C., a pressure ranging between 1.0 and 10 MPa and a pressing time ranging between 20 seconds to 3 minutes.

19. A method of manufacturing a printed wiring board according to claim 15, wherein the roughening treatment comprises roughening using a potassium permanganate solution having a concentration in a range of 40 to 100 g/l under conditions including a temperature of the potassium permanganate solution in a range of 40 to 80° C. and an immersion time in a range of 0.5 to 10 minutes.

20. A method of manufacturing a printed wiring board according to claim 11, wherein the maximum roughness is in a range of 0.8 to 2.0 μm.

21. A method of manufacturing a printed wiring board according to claim 15, wherein the arithmetic mean deviation (Ra) of roughness is in a range of 0.2 to 0.7 μm.

22. A method of manufacturing a printed wiring board according to claim 15, wherein the arithmetic mean deviation (Ra) of roughness is in a range of 0.2 to 0.5 μm.

* * * * *